United States Patent
Kim

(10) Patent No.: US 10,236,333 B2
(45) Date of Patent: Mar. 19, 2019

(54) ORGANIC LIGHT-EMITTING DISPLAY DEVICE

(71) Applicant: Samsung Display Co., Ltd., Yongin-si (KR)

(72) Inventor: Hyoeng Ki Kim, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/672,292

(22) Filed: Aug. 8, 2017

(65) Prior Publication Data

US 2018/0062102 A1    Mar. 1, 2018

(30) Foreign Application Priority Data

Aug. 30, 2016   (KR) ........................ 10-2016-0111119

(51) Int. Cl.
*H01L 27/32* (2006.01)
*G02B 5/30* (2006.01)

(52) U.S. Cl.
CPC ...... *H01L 27/3276* (2013.01); *H01L 27/3258* (2013.01); *G02B 5/30* (2013.01); *H01L 27/322* (2013.01)

(58) Field of Classification Search
CPC .......... H01L 27/3244–27/3279; H01L 27/3297
See application file for complete search history.

(56) References Cited

U.S. PATENT DOCUMENTS

| 8,502,444 | B2 | 8/2013 | Chu et al. | |
|---|---|---|---|---|
| 8,624,868 | B2 | 1/2014 | Chang et al. | |
| 9,046,952 | B2 | 6/2015 | Kim et al. | |
| 2015/0060810 | A1* | 3/2015 | Han | H01L 27/3246 257/40 |
| 2016/0079333 | A1* | 3/2016 | Shishido | H01L 27/3218 257/72 |

* cited by examiner

*Primary Examiner* — Daniel P Shook

(74) *Attorney, Agent, or Firm* — H.C. Park & Associates, PLC

(57) ABSTRACT

An organic light-emitting display device having reduced color dispersion effects includes a substrate, a first conductive line disposed on the substrate, a second conductive line disposed on the same layer as the first conductive line and insulated from the first conductive line and a pixel electrode disposed on the first and second conductive lines and overlapping the first and second conductive lines. A distance between the first conductive line and the second conductive line is about 0 to 10 μm.

18 Claims, 30 Drawing Sheets

ORGANIC LIGHT-EMITTING DISPLAY DEVICE

CROSS-REFERENCE TO RELATED APPLICATION

This application claims priority from and the benefit of Korean Patent Application No. 10-2016-0111119, filed on Aug. 30, 2016, which is hereby incorporated by reference for all purposes as if fully set forth herein.

BACKGROUND

Field

The invention relates generally to an organic light-emitting display device, and, more particularly, to an organic light-emitting display device having plural conductive lines arrange to reduce color dispersion.

Discussion of the Background

With the development of multimedia, the importance of display devices is increasing. Accordingly, various types of display devices such as liquid crystal displays and organic light-emitting displays are being used.

Of those display devices, an organic light-emitting display displays an image using an organic light-emitting diode which generates light through excitation of electrons and holes. Organic light-emitting displays have the advantages of fast response speed, high luminance, wide viewing angle, and low power consumption.

An organic light-emitting display generally includes unit pixels, each composed of red, green and blue subpixels. Each of the subpixels is driven independently by a driving device having a plurality of thin-film transistors and various metal lines. Due to spacing constraints and other issues, the colored light reflected by the pixels may interfere with each other and cause separation of colors and color dispersion.

The above information disclosed in this Background section is only for enhancement of understanding of the background of the inventive concept, and, therefore, it may contain information that does not form the prior art that is already known in this country to a person of ordinary skill in the art.

SUMMARY

One or more embodiments of the invention provide an organic light-emitting display device that can reduce the undesirable separation of reflected colors.

One ore more embodiments of the invention also provide an organic light-emitting display device that can reduce production costs by eliminating the use of a polarizing plate during production.

Additional aspects will be set forth in the detailed description which follows, and, in part, will be apparent from the disclosure, or may be learned by practice of the inventive concept.

However, the inventive concepts are not restricted to the specific embodiments set forth herein. The above and other aspects of the inventive concepts will become more apparent to one of ordinary skill in the art to which the inventive concepts pertain by referencing the detailed description of the inventive concepts given below.

According to one aspect of the invention, an organic light-emitting display device includes a substrate, a first conductive line disposed on the substrate, a second conductive line disposed on the same layer as the first conductive line and insulated from the first conductive line, and a pixel electrode disposed on the first and second conductive lines and overlapping the first and second conductive lines. A distance between the first conductive line and the second conductive line may be about 0 to 10 μm.

A difference between a minimum distance from an upper surface of the substrate to a lower surface of the pixel electrode and a maximum distance from the upper surface of the substrate to the lower surface of the pixel electrode may be about 70 nm or less.

The display device may further include an insulating layer which is disposed between the first and second conductive lines and the substrate, and a overcoat layer which is disposed between the first and second conductive lines and the pixel electrode and has a first thickness and a second thickness, wherein the first thickness of the overcoat layer is defined as a minimum distance from an upper surface of the insulating layer to an upper surface of the overcoat layer, and the second thickness of the overcoat layer is defined as a maximum distance from the upper surface of the insulating layer to the upper surface of the overcoat layer, wherein a difference between the first thickness and the second thickness is about 70 nm or less.

The first thickness of the overcoat layer may be about 1.5 to 2.0 μm.

The display device may further include a first switching device which has a first electrode connected to the first conductive line, a second switching device which has a control electrode connected to a second electrode of the first switching device, a first electrode connected to the second conductive line, and a second electrode connected to the pixel electrode, and an organic emitting layer disposed on and overlapping the pixel electrode, wherein the pixel electrode and organic emitting layer are component parts of an organic light emitting diode.

The first conductive line may be a data line which provides a data signal to the first electrode of the first switching device, and the second conductive line may be a driving voltage line which provides a driving voltage to the first electrode of the second switching device.

The distance between the first conductive line and the second conductive line may be about 5 to 10 μm.

A distance from a side of the pixel electrode to a side of the first conductive line may be equal to a distance from the other side of the first conductive line to a side of the second conductive line and also equal to a distance from the other side of the second conductive line to the other side of the pixel electrode.

The display device may further include a black matrix which has an opening region overlapping the pixel electrode and a photosensitive member which overlaps the opening region.

The black matrix may be disposed on the pixel electrode, and the photosensitive member may be disposed on the black matrix to overlap the pixel electrode.

According to another aspect of the invention, an organic light-emitting display device includes a substrate, a first conductive line disposed on the substrate and extending in a first direction, a second conductive line extending in the first direction, and a pixel disposed on the first and second conductive lines and overlapping the first and second conductive lines. A distance between the first conductive line and the second conductive line may be about 0 to 10 μm in a plan view.

The display device may further include a connecting electrode disposed on a different layer from the second conductive line.

The pixel may include a driving transistor which has a source electrode connected to a driving voltage terminal and a drain electrode connected to the pixel electrode, and a switching transistor which has a drain electrode connected to a gate electrode of the driving transistor.

One of the first and second conductive lines may be a data line which provides a data signal to a source electrode of the switching transistor.

The display device may further include an initialization line configured to provide an initialization signal to the gate electrode of the driving transistor.

One of the first and second conductive lines may be a driving voltage line which is connected to the source electrode of the driving transistor and the driving voltage terminal.

The first and second conductive lines might not be electrically connected to the driving transistor and the switching transistor.

The display device may further include an insulating layer disposed between the first conductive line and the second conductive line.

The display device may further include an overcoat layer which is disposed between the second conductive line and the pixel electrode and has a first thickness and a second thickness, wherein the first thickness of the overcoat layer is defined as a minimum distance from an upper surface of the insulating layer to an upper surface of the overcoat layer, and the second thickness of the overcoat layer is defined as a maximum distance from the upper surface of the insulating layer to the upper surface of the overcoat layer, wherein a difference between the first thickness and the second thickness is about 70 nm or less.

A difference between a minimum distance from an upper surface of the substrate to a lower surface of the pixel electrode and a maximum distance from the upper surface of the substrate to the lower surface of the pixel electrode may be about 70 nm or less.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1:
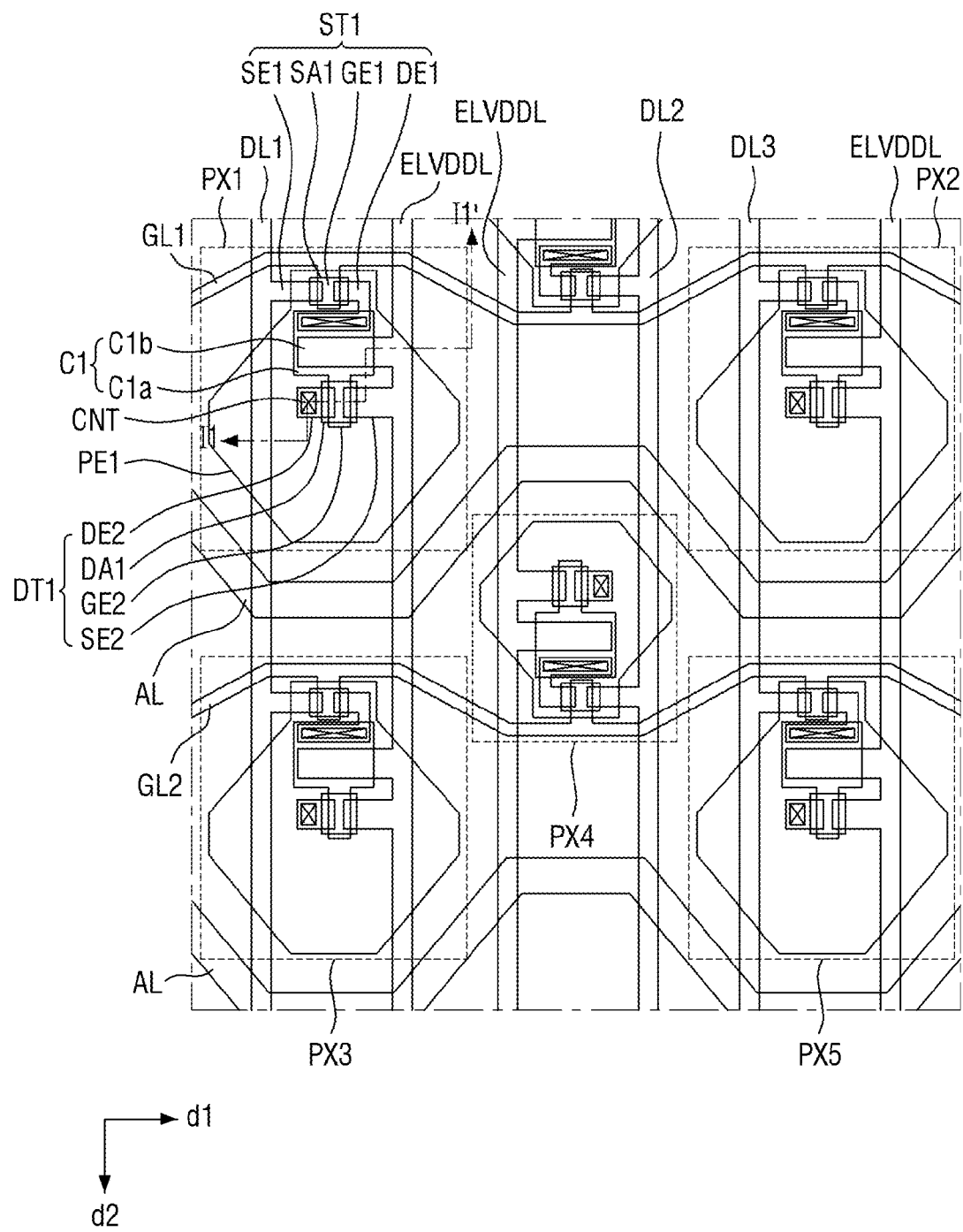
FIG. 1 is a schematic plan view of a first embodiment of an organic light-emitting display device constructed according to the principles of the invention.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Hereinafter, exemplary embodiments will be described with reference to the accompanying drawings.

Referring to FIG. 1, the organic light-emitting display device according to the embodiment may include a plurality of gate lines including first and second gate lines GL1 and GL2, a plurality of data lines including first through third data lines DL1 through DL3, a plurality of driving voltage lines ELVDDL, and a plurality of pixels including first through fifth pixels PX1 through PX5. The following description will be given based on the first pixel PX1.

The first pixel PX1 may be electrically connected to the first gate line GL1, the first data line DL1 and a driving voltage line ELVDDL. The first gate line GL1 may extend in a first direction d1. The first data line DL1 may extend in a second direction d2 different from the first direction d1. The driving voltage line ELVDDL may extend in the second direction d2. The driving voltage line ELVDDL may generally extend parallel to the first data line DL1. The first direction d1 may be perpendicular to the second direction d2. In FIG. 1, the first direction d1 is a row direction, and the second direction d2 is a row column direction.

The first pixel PX1 may include a first switching device ST1, a second switching device DT1, and a first capacitor C1.

The first switching device ST1 may be electrically connected to the first gate line GL1, the first data line DL1 and the second switching device DT1. In an embodiment, the first switching device ST1 may be a three-terminal device such as a thin-film transistor (TFT). A case where the first switching device ST1 is a TFT will be described below as an example.

The first switching device ST1 may include a first gate electrode GE1 which is electrically connected to the first gate line GL1, a first source electrode SE1 which is electrically connected to the first data line DL1, and a first drain electrode DE1 which is electrically connected to a second gate electrode GE2 of the second switching device DT1.

The second switching device DT2 may include the second gate electrode GE2 which is electrically connected to the first drain electrode DE1 of the first switching device ST1, a second source electrode SE2 which is electrically connected to the driving voltage line ELVDDL, and a second drain electrode DE2 which is electrically connected to a first pixel electrode PE1.

The first capacitor C1 may have a first electrode C1a electrically connected to the first drain electrode DE1 of the first switching device ST1 and a second electrode C1b electrically connected to the driving voltage line ELVDDL.

The first switching device ST1 may be turned on by a signal received from the first gate line GL1 to provide a data signal received from the first data line DL1 to the first capacitor C1. The first capacitor C1 may be charged with a difference between a voltage of the data signal and a driving voltage received from the driving voltage line ELVDDL. The second switching device DT1 may control the amount of driving current provided from the driving voltage line ELVDDL to the first pixel electrode PE1 according to the voltage that charges the first capacitor C1.

That is, the first switching device ST1 may be a switching transistor, and the second switching device DT1 may be a driving transistor.

Figure 2:
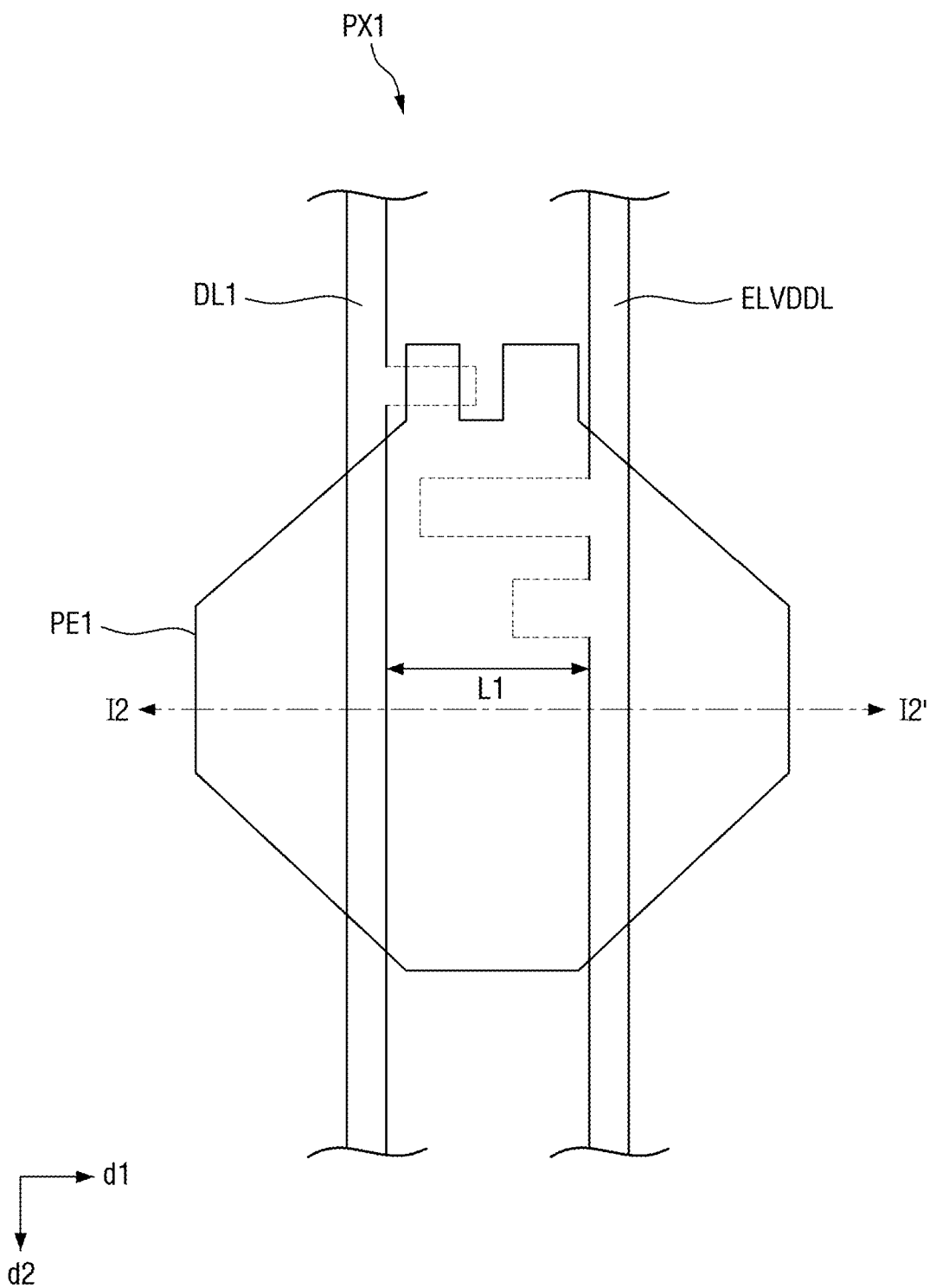
FIG. 2 is an enlarged, fragmented, view of area PX1 of FIG. 1, including a first pixel electrode, a first data line and a driving voltage line.

Referring to FIG. 2, the first data line DL1 and the driving voltage line ELVDDL may generally extend in the same direction, that is, in the second direction d2. In addition, the first data line DL1 and the driving voltage line ELVDDL are insulated from each other. The first pixel electrode PE1 overlaps the first data line DL1 and the driving voltage line ELVDDL. When two elements overlap each other, it means that the two elements are disposed on and under each other to vertically overlap each other on a lower substrate 110 (see FIG. 3).

The first pixel electrode PE1 may overlap a first conductive line and a second conductive line. Here, an embodiment of the first conductive line may be the first data line DL1, and an embodiment of the second conductive line may be the driving voltage line ELVDDL. A case where the first conductive line is the first data line DL1 and the second data line is the driving voltage line ELVDDL will be described below as an example.

The first pixel electrode PE1 may be spatially split by the first data line DL1 and the driving voltage line ELVDDL. This will be described later with reference to FIG. 8. A distance L1 between the first data line DL1 and the driving voltage line ELVDDL may be greater than 10 μm. A distance between two adjacent lines is defined herein as a shortest distance from a side of a line to a side of the other line which faces the side of the first line.

Figure 3:
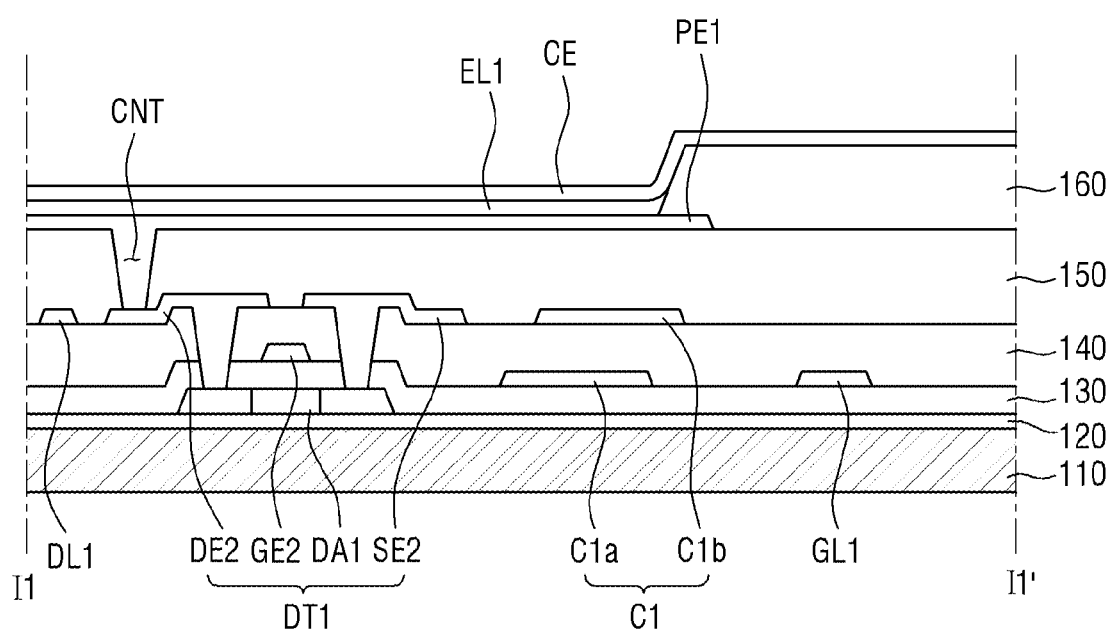
FIG. 3 is a cross-sectional side view taken along the line I1-I1' of FIG. 1.

Referring to FIG. 3, the lower substrate 110 may be an insulating substrate. The lower substrate 110 may be a glass substrate, a quartz substrate, a ceramic substrate or a plastic substrate. In an embodiment, the lower substrate 110 may be a flexible substrate that can be bent, folded, or rolled. In this case, the lower substrate 110 may be made of, but not limited to, polyimide.

A buffer layer 120 may be disposed on the lower substrate 110. The buffer layer 120 may prevent the penetration of impurity elements and planarize the surface. In an embodiment, the buffer layer 120 may include any one of a silicon nitride (SiNx) layer, a silicon oxide ($SiO_2$) layer, and a silicon oxynitride (SiOxNy) layer. The buffer layer 120 can be omitted depending on the type, processing conditions, etc. of the lower substrate 110.

A semiconductor layer including a first semiconductor pattern SA1 and a second semiconductor pattern DA1 may be disposed on the buffer layer 120. The first semiconductor pattern SA1 may form the first switching device ST1 together with the first source electrode SE1, the first drain electrode DE1 and the first gate electrode GE1. The second semiconductor pattern DA1 may form the second switching device DT1 together with the second source electrode SE2, the second drain electrode DE2 and the second gate electrode GE2. In an embodiment, each of the first semiconductor pattern SA1 and the second semiconductor pattern DA1 may be made of one or a mixture of at least two of amorphous silicon, polycrystalline silicon, monocrystalline silicon, and low-temperature polycrystalline silicon. In an embodiment, each of the first semiconductor pattern SA1 and the second semiconductor pattern DA1 may include an oxide semiconductor.

A first insulating layer 130 may be disposed on the semiconductor layer. In an embodiment, the first insulating layer 130 may be a gate insulating layer. The first insulating layer 130 may be made of any one or a mixture of one or more of inorganic insulating materials such as silicon oxide (SiOx) and silicon nitride (SiNx) and organic insulating materials such as benzocyclobutene (BCB), an acrylic material and polyimide.

A gate conductor including the first gate line GL1, the second gate line GL2, the first gate electrode GE1, the second gate electrode GE2 and the first electrode C1a of the first capacitor C1 may be disposed on the first insulating layer 130. The first gate electrode GE1 may extend from the first gate line GL1 and overlap the first semiconductor pattern SA1. The second gate electrode GE2 may extend from the second gate line GL2 and overlap the second semiconductor pattern DA1. The first electrode C1a of the first capacitor C1 may be at least partially overlap the second electrode C1b of the first capacitor C1 which will be described later. Accordingly, the first electrode C1a of the first capacitor C1 may be capacitively coupled to the second electrode C1b of the first capacitor C1. The gate conductor may include one or more of aluminum (Al)-based metal including an aluminum alloy, silver (Ag)-based metal including a silver alloy, copper (Cu)-based metal including a copper alloy, molybdenum (Mo)-based metal including a molybdenum alloy, chrome (Cr), titanium (Ti), and tantalum (Ta).

A second insulating layer 140 may be disposed on the gate conductor. The second insulating layer 140 may be made of any one or a mixture of one or more of inorganic insulating materials such as silicon oxide (SiOx) and silicon nitride (SiNx) and organic insulating materials such as benzocyclobutene (BCB), an acrylic material and polyimide.

A data conductor including the first data line DL1, the second data line DL2, the third data line DL3, the driving voltage lines ELVDDL, the first source electrode SE1, the first drain electrode DE1, the second source electrode SE2, the second drain electrode DE2 and the second electrode C1b of the first capacitor C1 may be disposed on the second insulating layer 140. The first source electrode SE1 and the first drain electrode DE1 may be disposed on the second insulating layer 140 separated from each other and may overlap the first semiconductor pattern SA1. The second source electrode SE2 and the second drain electrode DE2 may be disposed on the second insulating layer 140 separated from each other and may overlap the second semiconductor pattern DA1. The data conductor may include one or more of a metal, an alloy, metal nitride, conductive metal nitride, and a transparent conductive material. In an embodiment, the data conductor may have a single layer structure or a multilayer structure composed of one or more of nickel (Ni), cobalt (Co), titanium (Ti), silver (Ag), copper (Cu), molybdenum (Mo), aluminum (Al), beryllium (Be), niobium (Nb), gold (Au), iron (Fe), selenium (Se), and tantalum (Ta). In addition, each of the source electrode SE and the drain electrode DE may be made of an alloy of any one of the above metals and one or more elements selected from titanium (Ti), zirconium (Zr), tungsten (W), tantalum (Ta), niobium (Nb), platinum (Pt), hafnium (Hf), oxygen (O) and nitrogen (N).

A overcoat layer 150 may be disposed on the data conductor. The overcoat layer 150 removes a step difference, thereby increasing light emission efficiency of the first pixel electrode PE1 and a first organic emitting layer EL1. In an embodiment, the overcoat layer 150 may include an organic material. For example, the overcoat layer 150 may include any one or more of polyimide, polyacryl, and polysiloxane. A contact hole CNT which exposes at least part of the second drain electrode DE2 may be formed in the overcoat layer 150.

The first pixel electrode PE1 may be disposed on the overcoat layer 150. The first pixel electrode PE1 may be electrically connected to the second drain electrode DE2 which is exposed by the contact hole CNT. That is, the first pixel electrode PE1 may be an anode which is a hole injection electrode. In an embodiment, the first pixel electrode PE1 may be made of a transparent conductive material such as indium tin oxide (ITO) or indium zinc oxide (IZO) or a reflective metal such as aluminum, silver, chrome or an alloy of the same.

An auxiliary line AL may be disposed on the overcoat layer 150. That is, the auxiliary line AL may be disposed on the same layer as the first pixel electrode PE1 but may be insulated from the first pixel electrode PE1. In other words, the auxiliary line AL and the first pixel electrode PE1 may be formed by the same mask process. In an embodiment, the auxiliary line AL may be an initialization voltage line which provides an initialization voltage to the second switching device DT1. The auxiliary line AL may be electrically connected to the second switching device DT1 by another switching device.

The auxiliary line AL is not necessarily disposed on the overcoat layer 150 and can be disposed on another layer depending on its relationship with other elements. In addition, the auxiliary line AL is not limited to the initialization voltage line and can also be a bypass line which prevents the leakage of current or a signal line. Further, the auxiliary line AL can be omitted.

A pixel defining layer 160 may be disposed on the first pixel electrode PE1. The pixel defining layer 160 exposes part of the first pixel electrode PE1. The pixel defining layer 160 may be made of resin such as polyacrylates resin, polyimides, etc.

The first organic emitting layer EL1 may be disposed on the first pixel electrode PE1 and the pixel defining layer 160. More specifically, the first organic emitting layer EL1 may be disposed on the first pixel electrode PE1 which is exposed by the pixel defining layer 160. The first organic emitting layer EL1 may include a small molecular weight organic material or a polymer organic material. In an embodiment, the first organic emitting layer EL1 may include one or more of a hole injection layer, a hole transporting layer, an emitting layer, an electron transporting layer, and an electron injection layer.

A common electrode CE may be disposed on the first organic emitting layer EL1 and the pixel defining layer 160. In an embodiment, the common electrode CE may be formed as a transflective layer. More specifically, the common electrode CE may include at least one of magnesium (Mg), silver (Ag), calcium (Ca), lithium (Li), chrome (Cr), aluminum (Al), copper (Cu), ITO, IZO and ZNO. The common electrode CE may be a single layer or a multilayer made of different materials. The common electrode CE may be a cathode which is an electron injection electrode. However, the common electrode CE is not limited to the cathode. That is, depending on the driving method and disposition structure, the first pixel electrode PE1 can be a cathode, and the common electrode CE can be an anode.

Figure 4:
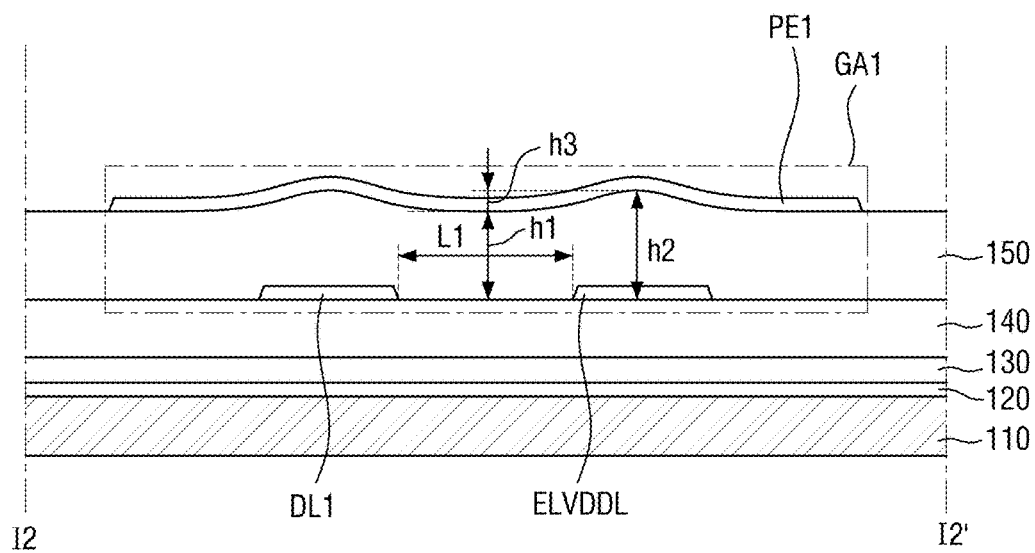
FIG. 4 is a cross-sectional side view taken along the line I2-I2' of FIG. 2.

The structure shown in FIG. 4 may be implemented in connection with other elements such as the common electrode CE disposed on the first pixel electrode PE1 as shown and described elsewhere herein.

Referring to FIG. 4, the first data line DL1 may be disposed on the same layer as the driving voltage line ELVDDL and may be insulated from the driving voltage line ELVDDL. The first data line DL1 and the driving voltage line ELVDDL may overlap the first pixel electrode PE1. The distance L1 between the first data line DL1 and the driving voltage line ELVDDL may be greater than about 10 μm. However, to minimize a coupling phenomenon between the two lines, and for other reasons described elsewhere herein, the distance L1 between the first data line DL1 and the driving voltage line ELVDDL may be less than about 10 μm. Hereinafter, for convenience the distance L1 between the two lines will be described herein as being about 5 to about 10 μm.

The overcoat layer 150 may have a first thickness h1 and a second thickness h2. The first thickness h1 of the overcoat layer 150 is a minimum distance from an upper surface of the second insulating layer 140 to an upper surface of the overcoat layer 150 in a first pixel area GA1. In FIG. 4, since the first data line DL1 and the driving voltage line ELVDDL are disposed on the second insulating layer 140, the first thickness h1 of the overcoat layer 150 is defined based on the upper surface of the second insulating layer 140. However, when the first data line DL1 and the driving voltage line ELVDDL are disposed on the lower substrate 110, the first thickness h1 of the overcoat layer 150 may be defined based on an upper surface of the lower substrate 110. FIG. 5A, FIG. 5B, FIG. 6A and FIG. 6B are examples of such embodiments.

The second thickness h2 of the overcoat layer 150 is a minimum distance from the upper surface of the second insulating layer 140 to the upper surface of the overcoat layer 150 in the first pixel area GA1. That is, the second thickness h2 of the overcoat layer 150 may be defined as a maximum distance from a lower surface of the driving voltage line ELVDDL to the upper surface of the overcoat layer 150. The second thickness h2 of the overcoat layer 150 may also be defined as a maximum distance from a lower surface of the first data line DL1 to the upper surface of the overcoat layer 150.

A step difference h3 of the overcoat layer 150 in the first pixel area GA1 is defined as a difference between the first thickness h1 and the second thickness h2 of the overcoat layer 150 and may be about 70 μm or less. The first thickness h1 of the overcoat layer 150 may be about 1.5 to 2.0 μm. The second thickness h2 of the overcoat layer 150 is not limited to a particular thickness as long as the step difference h3 of the overcoat layer 150 is about 70 μm or less.

The relationship between a distance between two electrodes and a step difference of an overcoat layer will now be described in greater detail with reference to FIGS. 5A and 5B.

A first electrode 2, a second electrode 3, a third electrode 5, and a fourth electrode 6 include a conductive material and are insulated from each other. First and second overcoat layers 4 and 7 include an organic material. The first overcoat layer 4 is disposed on the first electrode 2 and the second electrode 3. The second overcoat layer 7 is disposed on the third electrode 5 and the fourth electrode 6. Here, it is assumed that the first through fourth electrodes 2, 3, 5 and 6 have the same thickness.

Figure 5A:
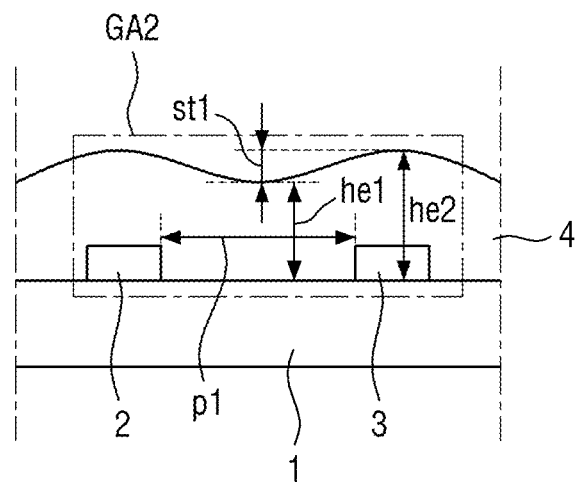
FIG. 5A and FIG. 5B are cross-sectional side views of second and third embodiments of an organic light-emitting display device constructed according to the principles of the invention illustrating variations in a step difference of an overcoat layer according to variations in a distance between metal wiring layers.

Referring to FIG. 5A, the first overcoat layer 4 may have a first thickness he1 and a second thickness he2. The first thickness he1 of the first overcoat layer 4 is a minimum distance from a substrate 1 to an upper surface of the first overcoat layer 4 in a second pixel area GA2. The second thickness he2 of the first overcoat layer 4 is a maximum distance from the substrate 1 to the upper surface of the first overcoat layer 4 in the second pixel area GA2. While the second thickness he2 of the first overcoat layer 4 is defined based on a lower surface of the second electrode 3, it can also be defined based on a lower surface of the first electrode 2.

The first thickness he1 and the second thickness he2 of the first overcoat layer 4 are different from each other. More specifically, the thickness (i.e., the second thickness he2) of the first overcoat layer 4 in an area in which the second electrode 2 or the third electrode 3 is disposed is greater than the thickness (i.e., the first thickness he1) of the first overcoat layer 4 in an area in which the second electrode 2 or the third electrode 3 is not disposed. Such a difference in the thickness of the first overcoat layer 4 may vary according to the thickness of the second electrode 2 or the third electrode 3.

Figure 5B:
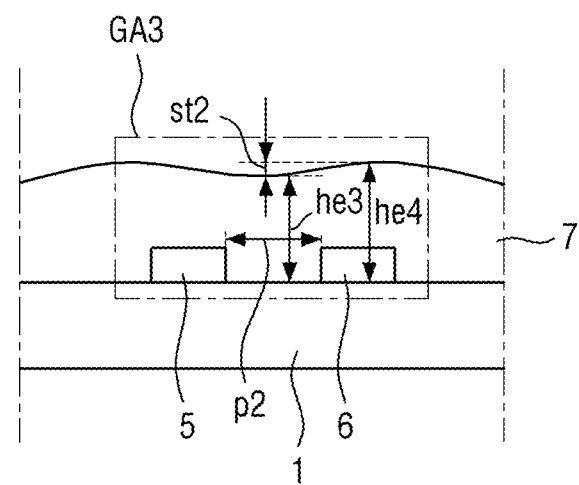

Referring to FIG. 5B, the second overcoat layer 7 may have a third thickness he3 and a fourth thickness he4. The third thickness he3 of the second overcoat layer 7 is a minimum distance from the substrate 1 to an upper surface of the second overcoat layer 7 in a third pixel area GA3. The fourth thickness he4 of the second overcoat layer 7 is a maximum distance from the substrate 1 to the upper surface of the second overcoat layer 7 in the third pixel area GA3. While the fourth thickness he4 of the second overcoat layer 7 is defined based on a lower surface of the fourth electrode 6, it can also be defined based on a lower surface of the third electrode 5.

The third thickness he3 and the fourth thickness he4 of the second overcoat layer 7 are different from each other. As described above, the fourth thickness he3 is greater than the third thickness he3.

A distance p1 between the first electrode 2 and the second electrode 3 is greater than a distance p2 between the third electrode 5 and the fourth electrode 6. Accordingly, a first step difference st1 which is defined as an absolute value of a difference between the first thickness he1 and the second thickness he2 is greater than a second step difference st2 which is defined as an absolute value of a difference between the third thickness he3 and the fourth thickness he4.

That is, the greater the distance between two electrodes, the greater the step difference of the overcoat layer.

Figure 6A:
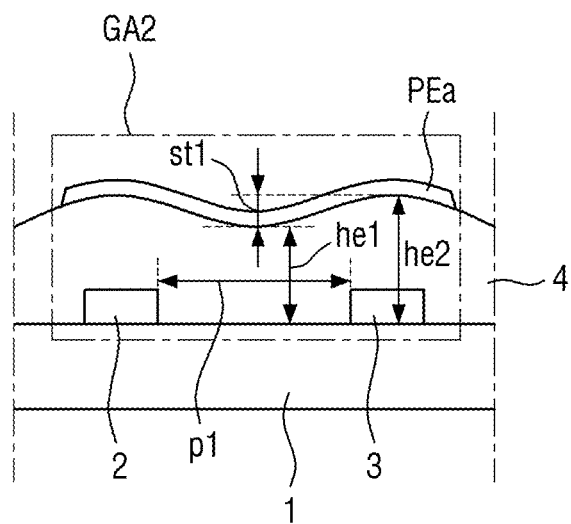
FIG. 6A and FIG. 6B are cross-sectional side views of fourth and fifth embodiments of an organic light-emitting display device constructed according to the principles of the invention illustrating variations in a step difference of a pixel electrode according to a step difference of an overcoat layer caused by variations in a distance between metal wiring layers.

A step difference of a overcoat layer and a step difference of a pixel electrode will now be described in greater detail with reference to FIGS. 6A and 6B. FIG. 6A illustrates a pixel electrode PEa added to FIG. 5A, and FIG. 6B illustrates a pixel electrode PEb added to FIG. 5B.

Figure 6B:
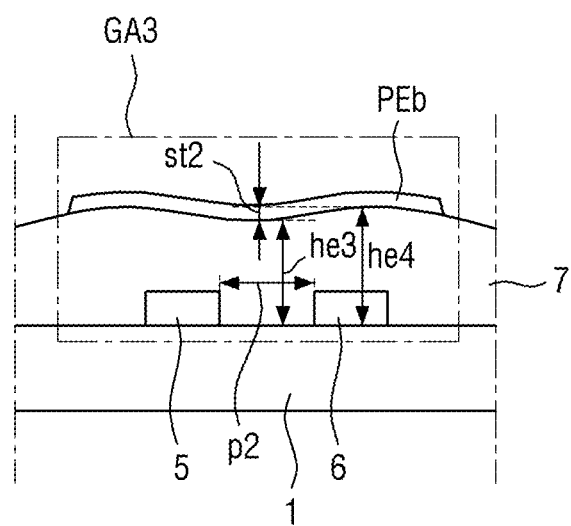

Referring to FIGS. 5A, 5B, 6A and 6B, the pixel electrode PEa is disposed on the first overcoat layer 4. The pixel electrode PEb is disposed on the second overcoat layer 7. Here, since the first step difference st1 of the first overcoat layer 4 is greater than the second step difference st2 of the second overcoat layer 7, the pixel electrode PEb disposed on the second overcoat layer 7 has a smaller step difference than the pixel electrode PEa disposed on the first overcoat layer 4. In FIGS. 6A and 6B, a step difference of a pixel electrode refers to a distance from a lowest area of a lower surface of the pixel electrode to a highest area of an upper surface of the pixel electrode. This may be substantially the same as a step difference of an overcoat layer.

That is, an increase in the distance between two electrodes disposed on a substrate increases a step difference of an overcoat layer, thereby increasing a step difference of a pixel electrode disposed on the overcoat layer.

Referring back to FIG. 4, the distance L1 between the first data line DL1 and the driving voltage line ELVDDL may be about 5 to 10 μm. The first thickness h1 of the overcoat layer 150 may be about 1.5 to 2.0 μm. The step difference h3 of the overcoat layer 150 which is defined as the difference between the first thickness h1 and the second thickness h2 of the overcoat layer 150 may be about 70 μm or less. Accordingly, the step difference of the first pixel electrode PE1 disposed on the overcoat layer 150 may also be about 70 μm or less. As a result, the first pixel electrode PE1 may have uniform flatness. The second thickness h2 of the overcoat layer 150 is not limited to a particular thickness as long as the step difference h3 of the overcoat layer 150 is about 70 μm or less.

The step difference h3 of the overcoat layer 150 may also be defined as a distance between the lower substrate 110 and the first pixel electrode PE1. That is, since different elements are disposed between the lower substrate 110 and the first data line DL1 and the driving voltage line ELVDDL in FIG. 4, the step difference h3 of the overcoat layer 150 is described based on the second insulating layer 140. However, the step difference h3 of the overcoat layer 150 can also be defined based on the lower substrate 110 as in FIGS. 6A and 6B.

More specifically, the step difference h3 of the overcoat layer 150 may be defined as a difference between a minimum distance from the upper surface of the lower substrate 110 to a lower surface of the first pixel electrode PE1 and a maximum distance from the upper surface of the lower substrate 110 to the lower surface of the first pixel electrode PE1. Here, the difference between the minimum distance from the upper surface of the lower substrate 110 to the lower surface of the first pixel electrode PE1 and the maximum distance from the upper surface of the lower substrate 110 to the lower surface of the first pixel electrode PE1 is about 70 μm or less.

TABLE 1

| Distance (μm) between lines | Step difference (nm) of overcoat layer |
|---|---|
| 5.0 | 42.9 |
| 15.0 | 189.7 |
| 20.0 | 253.7 |

Table 1 shows the how the step difference (nm) of the overcoat layer 150 varies according to the distance (μm) between lines in a case where the overcoat layer 150 has a thickness of about 1.5 nm.

Referring to Table 1, the step difference of the overcoat layer 150 exceeds 70 nm when the distance between lines exceeds a value that is somewhat less than 15 μm. In this case, the undesired separation of reflected colors occurs. On the other hand, the step difference of the overcoat layer 150 is less than 70 nm when the distance between lines is 5 μm. Accordingly, the color separation phenomenon due to external light can be improved in a plurality of pixels including the first pixel PX1 by maintaining a shorter permissible distance between the lines.

That is, in the organic light-emitting display device according to the embodiment, the distance between the first data line DL1 and the driving voltage line ELVDDL which are overlapped by the first pixel electrode PE1 is about 5 to 10 μm, and the thickness of the overcoat layer 150 is about 1.5 to 2.0 μm. Therefore, the step difference h3 of the overcoat layer 150 may be about 70 nm or less, and accordingly, the step difference of the first pixel electrode PE1 disposed on the overcoat layer 150 may be about 70 nm or less. As a result, the first pixel electrode PE1 may have uniform flatness. Hence, the color separation phenomenon due to external light can be improved in a plurality of pixels including the first pixel PX1, which, in turn, improves the separation of reflected color. Further, since a polarizing plate required to prevent introduction of external light can be omitted from the organic light-emitting display device constructed according to the principles of the invention, production costs due to this plate can be saved.

Figure 7A:
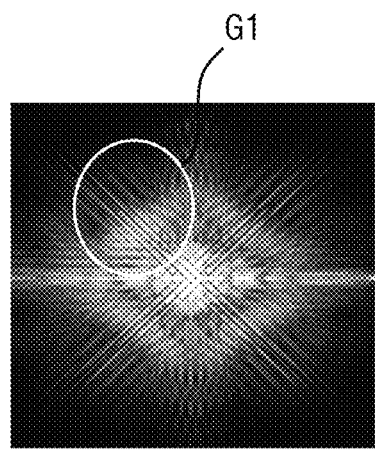
FIG. 7A is a color photograph showing the perception of color due to light reflected from a comparative embodiment of an organic light-emitting display device.
Figure 7B:
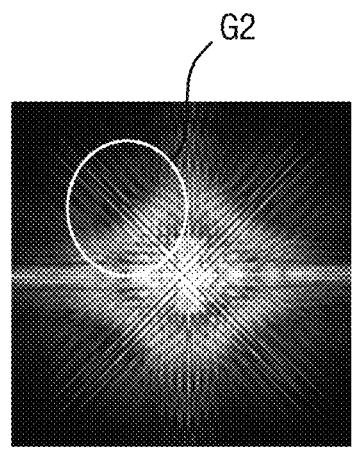
FIG. 7B is a color photograph showing the perception of color due to light reflected from an embodiment of an organic light-emitting display device constructed according to the principles of the invention.

The thickness of the overcoat layer in the comparative example of FIG. 7A is the same as the thickness of the overcoat layer in the inventive embodiment of FIG. 7B. However, the distance between two conductive lines overlapped by a pixel electrode exceeds 10 μm in the comparative embodiment of FIG. 7A whereas the distance between two conductive lines overlapped by a pixel electrode is 10 μm or less in the embodiment of FIG. 7B.

Referring to FIG. 7A, color separation phenomenon in the reflected external light may occur in a first area G1 of the organic light-emitting display device according to the comparative example. On the other hand, referring to FIG. 7B, the organic light-emitting display device constructed according to the principles of the invention has improved separation of reflected color in second area G2, which is a similar location as the location of the first area G1.

The structure shown in FIG. 4 may be implemented in connection with other elements such as the common electrode CE, black matrix BM and so on, disposed on the first pixel electrode PE1, as described elsewhere herein.

Figure 8:
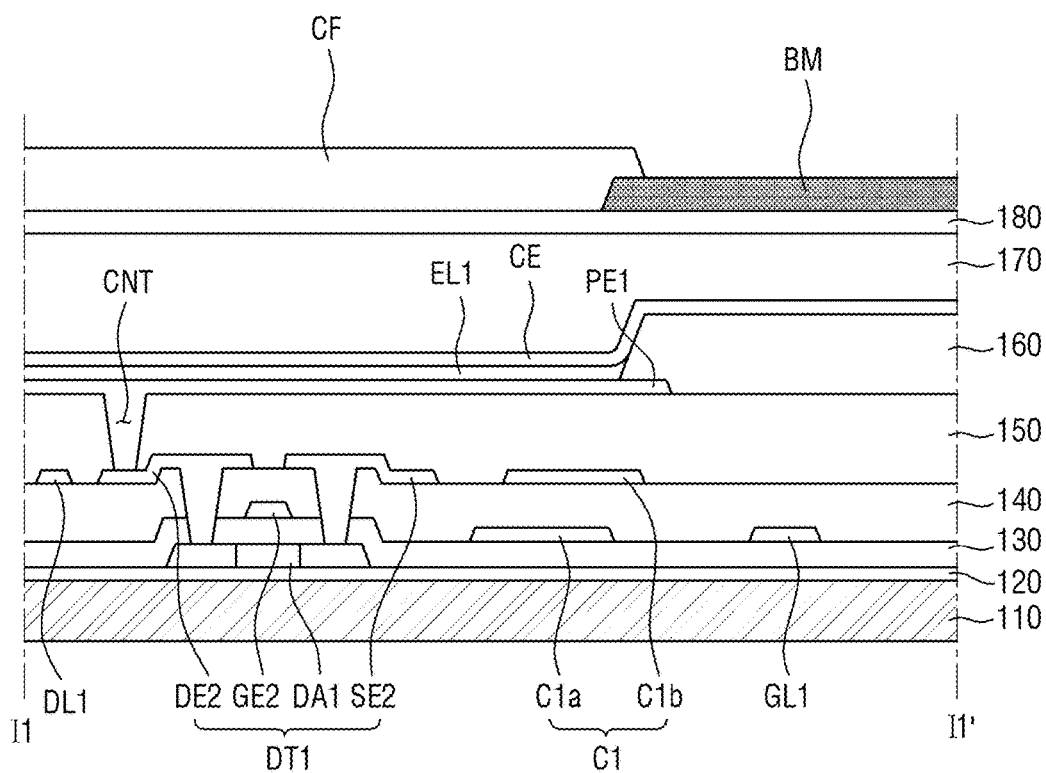
FIG. 8 is a cross-sectional side view of a sixth embodiment of an organic light-emitting display device constructed according to the principles of the invention, the cross-section being taken along the line I1-I1' of FIG. 1.

Referring to FIG. 8, an encapsulation layer 170 may be disposed on the common electrode CE. The encapsulation layer 170 may protect the organic light-emitting display device from foreign matter or outside air. The encapsulation layer 170 may made of any one or more of acrylic resin, epoxy resin, polyimide, polyethylene, a silicon compound, metal oxide, metal nitride, and metal carbide. However, this is merely an example, and the type of the encapsulation layer 170 is not limited to the above examples. In addition, the encapsulation layer 170 may be a single layer or a multilayer composed of, e.g., an organic layer and an inorganic layer stacked alternately.

A third insulating layer 180 may be disposed on the encapsulation layer 170. The third insulating layer 180 may be made of inorganic matter or organic matter. The third insulating layer 180 can be omitted.

The black matrix BM may be disposed on the third insulating layer 180. The black matrix BM may absorb at least part of external light or at least part of external light reflected inside the organic light-emitting display device, thereby preventing the external light from affecting the display quality of the organic light-emitting display device. In an embodiment, the black matrix BM may be made of a metallic material containing organic matter or chrome.

A color filter CF may be disposed on a portion of the third insulating layer 180 on which the black matrix BM is not disposed. The color filter CF may absorb at least part of external light or at least part of external light reflected inside the organic light-emitting display device, thereby preventing the external light from affecting the display quality of the organic light-emitting display device. This property of absorbing light may be referred to as photosensitivity. Thus, the color filter CF may be photosensitive.

In an embodiment, the color filter CF may overlap a plurality of organic emitting layers including the first organic emitting layer EL1. The color filter CF may be one of a red color filter, a green color filter and a blue color filter. The color of the color filter CF may correspond to the display color of an organic emitting layer which overlaps the color filter CF. Accordingly, image resolution can be improved.

The color of the color filter CF can also be different from the display color of the organic emitting layer which overlaps the color filter CF. In addition, all color filters CF can have the same color. Further, the black matrix BM can be formed after the color filter CF is formed.

The black matrix BM and/or the color filter CF disposed on the encapsulation layer 170 can prevent external light from affecting display quality. Accordingly, a polarizing plate can be omitted. The omission of the polarizing plate can save product cost or reduce product thickness.

Figure 9:
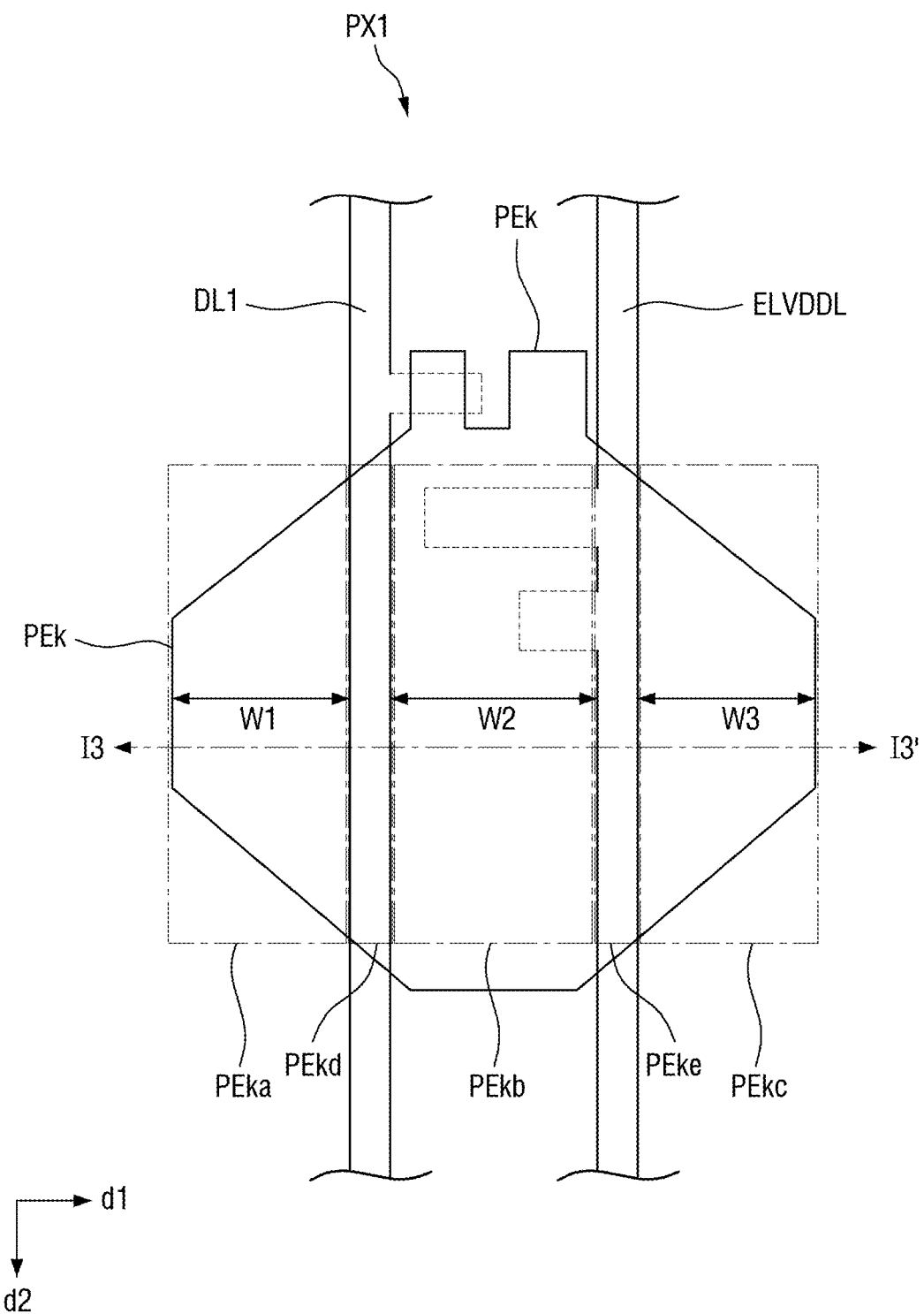
FIG. 9 is an enlarged, fragmented, view of area PX1 of FIG. 1 emphasizing the features differently than FIG. 2.
Figure 10:
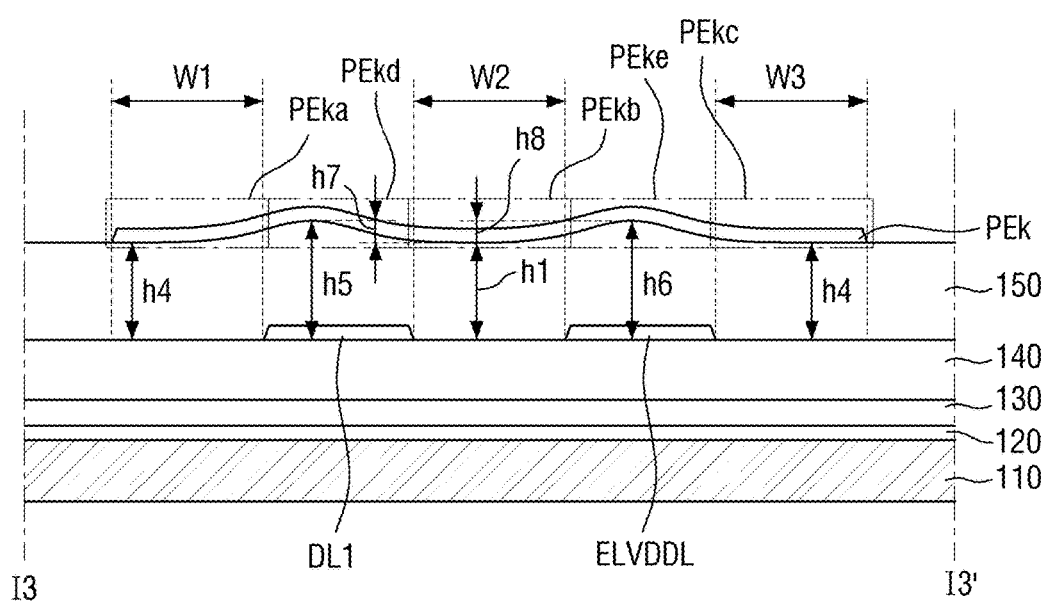
FIG. 10 is a cross-sectional side view taken along the line I3-I3' of FIG. 9 and emphasizing the features differently than the equivalent FIG. 4.

Referring to FIG. 9 and FIG. 10, the first pixel electrode PE1 may include a first area PE1a, a second area PE1b, and a third area PE1c. The first area PE1a may be disposed on a side of the first data line DL1, and the second area PE1b may be disposed on the other side of the first data line DL1 and on a side of the driving voltage line ELVDDL. The third area PE1c may be disposed on the other side of the driving voltage line ELVDDL.

That is, the first data line DL1 may be disposed between the first area PE1a and the second area PE1b, and the driving voltage line ELVDDL may be disposed between the second area PE1b and the third area PE1c. Here, a width W1 of the first area PE1a, a width W2 of the second area PE1b and a width W3 of the third area PE1c may be substantially equal. That is, the first pixel electrode PE1 may be split into the first through third areas PE1a through PE1c having equal widths by the first data line DL1 and the driving voltage line ELVDDL.

The first pixel electrode PE1 may further include a fourth area PE1d disposed between the first area PE1a and the second area PE1b and a fifth area PE1e disposed between the second area PE1b and the third area PE1c.

The overcoat layer 150 may have third through fifth thicknesses h4 through h6.

The third thickness h4 of the overcoat layer 150 is defined as a minimum distance from the upper surface of the second insulating layer 140 to the first area PE1a. Here, since the width W1 of the first area PE1a is substantially equal to each of the width W2 of the second area PE1b and the width W3 of the third area PE1c, the third thickness h4 of the overcoat layer 150 is also defined as a minimum distance from the upper surface of the second insulating layer 140 to the second area PE1b or the third area PE1c.

The fourth thickness h5 of the overcoat layer 150 is defined as a maximum distance from the upper surface of the second insulating layer 140 to the fourth area PE1d. That is, the fourth thickness h5 of the overcoat layer 150 is a maximum distance from a lower surface of the first data line DL1 to the upper surface of the overcoat layer 150. The fifth thickness h6 of the overcoat layer 150 is defined as a maximum distance from the upper surface of the second insulating layer 140 to the fifth area PE1e. The fifth thickness h6 of the overcoat layer 150 can also be defined as a maximum distance from a lower surface of the driving voltage line ELVDDL to the upper surface of the overcoat layer 150.

The fourth thickness h5 and the fifth thickness h6 of the overcoat layer 150 may be equal or different.

A distance between the first data line DL1 and the driving voltage line ELVDDL may be substantially equal to the width W2 of the second area PE1b. The width W2 of the second area PE1b may be about 5 to 10 μm.

A first step difference h7 of the overcoat layer 150 which is defined as a difference between the third thickness h4 and the fourth thickness h5 is about 70 nm or less. In addition, a second step difference h8 of the overcoat layer 150 which is defined as a difference between the third thickness h4 and the fifth thickness h6 may be about 70 nm or less. The third thickness h4 of the overcoat layer 150 may be about 1.5 to 2.0 μm. The fourth thickness h5 and the fifth thickness h6 of the overcoat layer 150 are not limited to any particular thickness as long as the first step difference h7 and the second step difference h8 are about 70 nm or less.

The first step difference h7 and the second step difference h8 of the overcoat layer 150 may vary according to the thicknesses, widths, etc. of the first data line DL1 and the driving voltage line ELVDDL but may both be about 70 nm or less.

Therefore, the first pixel electrode PE1 disposed on the overcoat layer 150 may have a step difference of about 70 nm or less in all areas. Accordingly, the color separation phenomenon due to external light can be improved in a plurality of pixels including the first pixel PX1.

Figure 11:
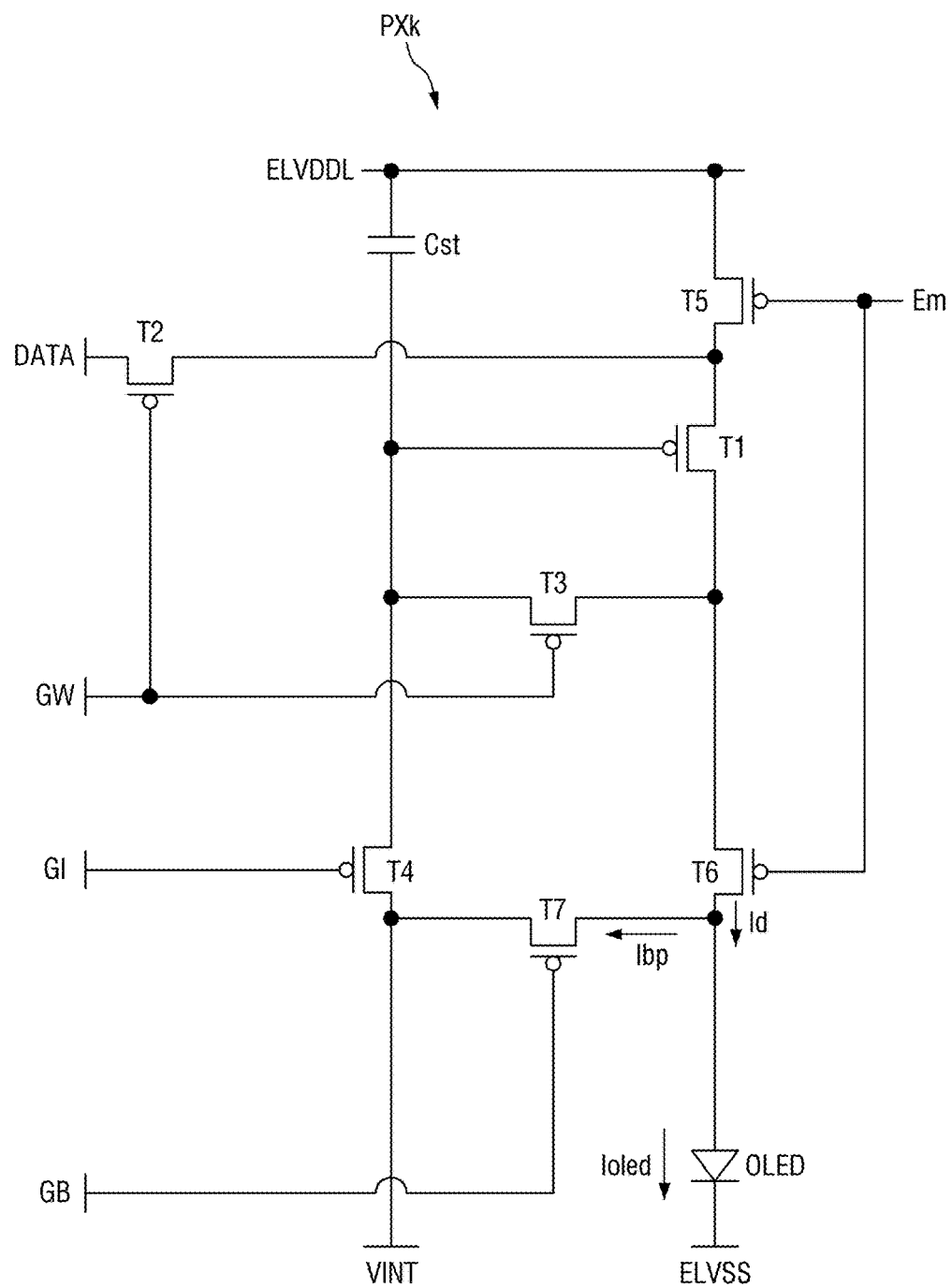
FIG. 11 is a schematic circuit diagram of a pixel of an organic light-emitting display device constructed according to the principles of the invention.

Referring to FIG. 11, a redundant description of elements and features described above with reference to FIGS. 1 through 10 will be omitted. In addition, for ease of description, a $k^{th}$ pixel PXk (where k is a natural number of 1 or greater) electrically connected to a data line and a gate line will be described as an example.

Referring to FIG. 11, the $k^{th}$ pixel PXk may include first through seventh transistors T1 through T7, a storage capacitor Cst, and an organic light-emitting diode OLED according to an embodiment.

The first transistor T1 may have a gate electrode electrically connected to a first electrode of the storage capacitor Cst and a source electrode electrically connected to a driving voltage line which provides a driving voltage ELVDD via the fifth transistor T5. In addition, the first transistor T1 may have a drain electrode electrically connected to a first electrode of the organic light-emitting diode OLED via the sixth transistor T6. The first transistor T1 may receive a data signal DATA according to a switching operation of the second transistor T2 which will be described later and provide the data signal DATA to the first electrode (e.g., an anode) of the organic light-emitting diode OLED. That is, the first transistor T1 may be a driving transistor.

The second transistor T2 may have a gate electrode electrically connected to a first gate line which provides a first gate signal GW and a source electrode electrically connected to a data line which provides the data signal DATA. The second transistor T2 may have a drain electrode electrically connected to the source electrode of the first transistor T1. In addition, the drain electrode of the second transistor T2 may be electrically connected to the driving voltage line which provides the driving voltage ELVDD via the fifth transistor T5. The second transistor T2 may be turned on by the first gate signal GW to provide the data signal DATA to the source electrode of the first transistor T1. That is, the second transistor T2 may be a switching transistor.

The third transistor T3 may have a gate electrode electrically connected to the first gate line which provides the first gate signal GW and a source electrode electrically connected to the drain electrode of the first transistor T1. In addition, the source electrode of the third transistor T3 may be electrically connected to the first electrode of the organic light-emitting diode OLED via the sixth transistor T6. A drain electrode of the third transistor T3 may be electrically connected to the first electrode of the storage capacitor Cst, a drain electrode of the fourth transistor T4 and the gate electrode of the first transistor T1. The third transistor T3 may be turned on by the first gate signal GW to connect the gate electrode and the drain electrode of the first transistor T1, thereby diode-connecting the first transistor T1. That is, the third transistor T3 may be a compensation transistor.

The fourth transistor T4 may have a gate electrode electrically connected to a second gate line which provides a second gate signal GI and a source electrode electrically connected to an initialization voltage line which provides an initialization voltage VINT. The drain electrode of the fourth transistor T4 may be electrically connected to the first electrode of the storage capacitor Cst, the drain electrode of the third transistor T3 and the gate electrode of the first transistor T1. Here, the second gate line may be a previous gate line of the first gate line. That is, the first gate signal GW may be provided to the $k^{th}$ pixel PXk before the second gate signal GI. A period in which the first gate signal GW is provided does not overlap a period in which the second gate signal GI is provided. This will be described in greater detail below in connection with FIG. 12. The fourth transistor T4 may be turned on by the second gate signal GI to provide the initialization voltage VINT to the gate electrode of the first transistor T1, thereby initializing the gate electrode of the first transistor T1. That is, the fourth transistor T4 may be an initialization transistor.

The fifth transistor T5 may have a gate electrode electrically connected to an emission control line which provides an emission control signal EM and a source electrode electrically connected to the driving voltage line which provides the driving voltage ELVDD. The fifth transistor T5 may have a drain electrode electrically connected to the source electrode of the first transistor T1 and the drain electrode of the second transistor T2.

The sixth transistor T6 may have a gate electrode electrically connected to the emission control signal which provides the emission control signal EM and a source electrode electrically connected to the drain electrode of the first transistor T1 and the source electrode of the third transistor T3. The sixth transistor T6 may have a drain electrode electrically connected to the first electrode of the organic light-emitting diode OLED.

The fifth and sixth transistors T5 and T6 may be turned on simultaneously by the emission control signal EM. The fifth transistor T5 may be turned on by the emission control signal EM to provide the driving voltage ELVDD to the source electrode of the first transistor T1. The sixth transistor T6 may be turned on at the same time as the fifth transistor T5. Accordingly, an emission current Ioled may flow to the first electrode of the organic light-emitting diode OLED. That is, the fifth transistor T5 may be an operation control transistor, and the sixth transistor T6 may be an emission control transistor.

The seventh transistor T7 may have a gate electrode electrically connected to a third gate line which provides a third gate signal GB and a source electrode electrically connected to the drain electrode of the sixth transistor T6 and the first electrode of the organic light-emitting diode OLED. In addition, the seventh transistor T7 may have a drain electrode electrically connected to the initialization voltage line which delivers the initialization voltage VINT and the source electrode of the fourth transistor T4. Here, the third gate signal GB may be a bypass signal. In an embodiment, the third gate signal GB may have the same driving period as the second gate signal GI. When the second gate signal GI and the third gate signal GB have the same driving period, they may be provided from one gate line. That is, the seventh transistor T7 may be a bypass transistor.

A second electrode of the storage capacitor Cst may be electrically connected to the driving voltage line. A second electrode of the organic light-emitting diode OLED may be electrically connected to a common voltage ELVSS. Here, the second electrode of the organic light-emitting diode OLED may be a cathode. The organic light-emitting diode OLED may emit light in response to a driving current Id received from the first transistor T1. It should be apparent as well that component parts of the organic light-emitting diode OLED may include at least one of the pixel electrode(s) and organic emitting layers described elsewhere herein.

Figure 12:
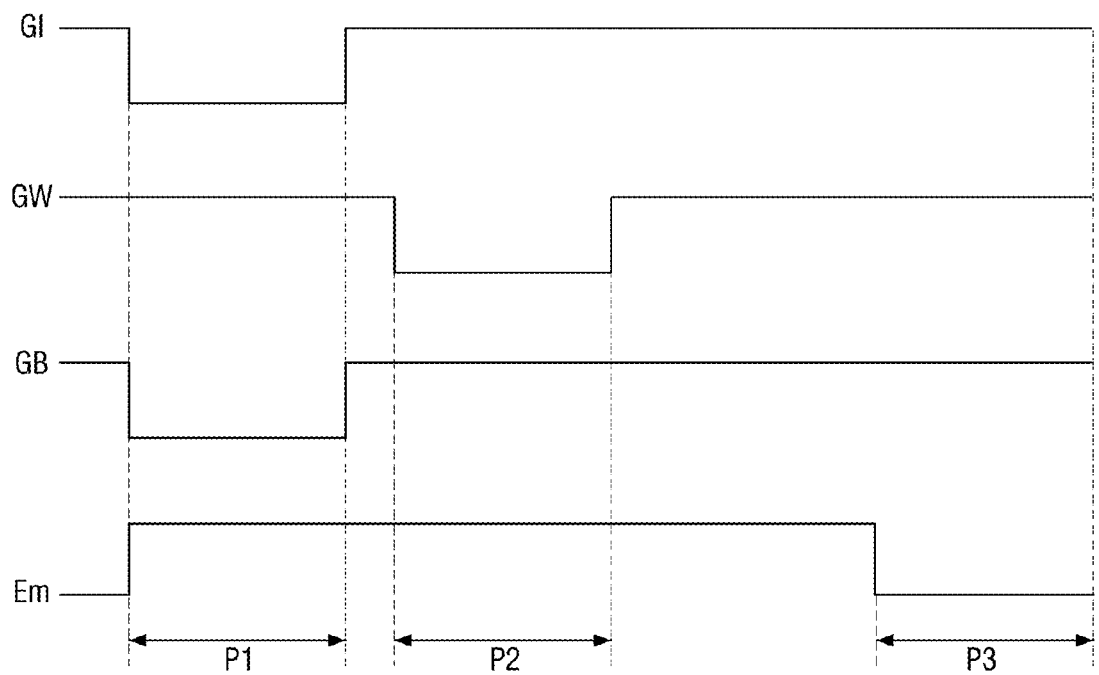
FIG. 12 is a graph of exemplary embodiments of various signals employed in the operation of the organic light-emitting display device of FIG. 11.

Referring to FIG. 12, in the first through seventh transistors T1 through T7, a gate-on voltage may be at a low level, and a gate-off voltage may be at a high level according to an embodiment. In addition, the third gate signal GB may have the same waveform as the second gate signal GI.

Referring to FIGS. 11 and 12, the organic light-emitting display device of FIG. 11 operates as follows.

In a first period P1, while the first gate signal GW is at a high level and the emission control signal EM is at a high level, the second gate signal GI transits from a high level to a low level.

In this case, the fourth and seventh transistors T4 and T7 may be turned on in a state where the second, third, fifth and sixth transistors T2, T3, T5 and T6 are turned off. Accordingly, the initialization voltage VINT may be provided to the gate electrode of the first transistor T1 via the turned-on fourth transistor T4. Therefore, the gate electrode of the first transistor T1 may be initialized to the initialization voltage VINT. In addition, the initialization voltage VINT may be provided to the first electrode of the organic light-emitting diode OLED via the turned-on seventh transistor T7. Therefore, the first electrode of the organic light-emitting diode OLED may be initialized to the initialization voltage VINT.

In a second period P2, the first gate signal GW transits from a high level to a low level, and the second and third gate signals GI and GB transit from a low level to a high level. In addition, the emission control signal EM is maintained at a high level.

Accordingly, the second and third transistors T2 and T3 are turned on, and the fourth and seventh transistors T4 and T7 are turned off. In this case, as the second transistor T2 is turned on, the data signal DATA is provided to the source electrode of the first transistor T1. In addition, as the third transistor T3 is turned on, the first transistor T1 is diode-connected. An electric current flows between the source electrode and the drain electrode of the first transistor T1, and voltage levels of the drain electrode and the gate electrode are changed until a voltage difference between the source electrode and the drain electrode of the first transistor T1 becomes equal to an absolute value of a threshold voltage of the first transistor T1. Then, a compensation voltage obtained by subtracting the absolute value of the threshold voltage of the first transistor T1 from a voltage level of the data signal DATA is provided to the gate electrode of the first transistor T1.

The compensation voltage is applied to the first electrode of the storage capacitor Cst, and the driving voltage ELVDD is applied to the second electrode of the storage capacitor Cst. Accordingly, electric charges corresponding to a difference between the compensation voltage and the driving voltage ELVDD are accumulated in the storage capacitor Cst.

In a third period P3, the emission control signal EM transits from a high level to a low level in a state where the first, second and third gate signals GW, GI and GB are at a high level.

Accordingly, the fifth and sixth transistors T5 and T6 are turned on in a state where the second, third, fourth and seventh transistors T2, T3, T4 and T7 are turned off. In this case, the driving current Id corresponding to a difference between a voltage of the gate electrode of the first transistor T5 and the driving voltage ELVDD is generated and provided to the organic light-emitting diode OLED via the turned-on sixth transistor T6. Here, the voltage of the gate electrode of the first transistor T1 is the compensation voltage.

During the third period P3, a source-gate voltage Vgs of the first transistor T1 is maintained at a level equal to the driving voltage minus the compensation voltage by the storage capacitor Cst. Therefore, the driving current Id may be proportional to the square of a value (i.e. the square of the difference between the driving voltage and the compensation voltage) obtained by subtracting the absolute value of the threshold voltage Vth from the source-gate voltage Vgs.

This ultimately indicates that the driving current Id can be determined regardless of the threshold voltage of the first transistor T1. Accordingly, a threshold voltage deviation of the first transistor T1 can be compensated for, and non-uniformity in the luminance of the organic light-emitting display device can be prevented.

In the third period P3, the seventh transistor T7 may remain turned off. In the third period P3, the bypass signal may be maintained at a level that can always turn the seventh transistor T7 off. Accordingly, the seventh transistor T7 may be turned off. In this state, part of the driving current Id may flow out through the seventh transistor T7 as a bypass current Ibp. Therefore, in a frame in which an image having black luminance is displayed, the emission current Ioled obtained by subtracting the amount of the bypass current Ibp flowing out through the seventh transistor T7 from the driving current Id may flow through the organic light-emitting diode OLED. Accordingly, the amount of the emission current Ioled may be at a minimum level that is enough to express the luminance of a black image. That is, since an image having accurate black luminance can be displayed using the seventh transistor T7, the contrast ratio of the image can be improved.

Figure 13:
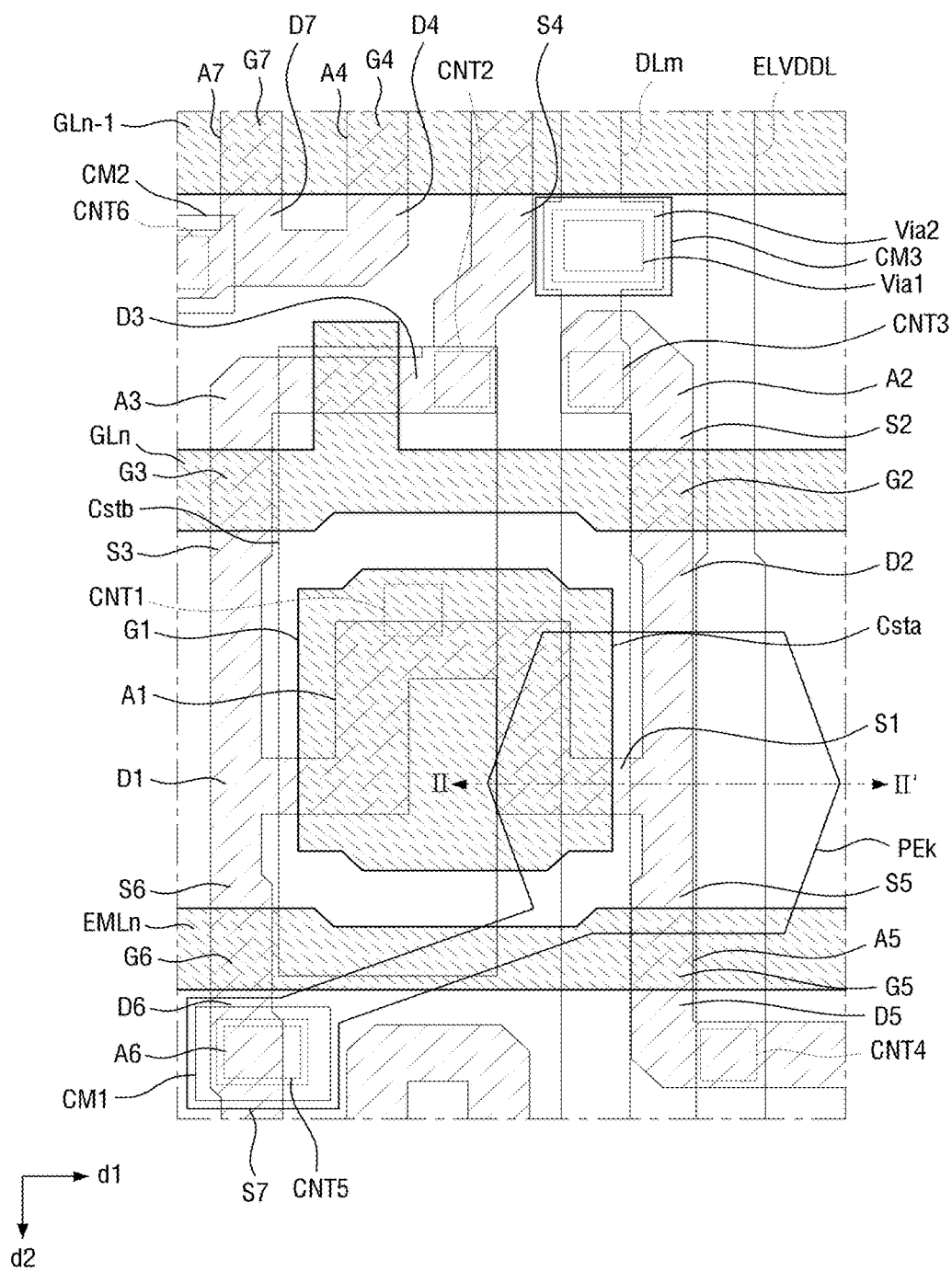
FIG. 13 is a schematic plan view of a pixel of the organic light-emitting display device of FIG. 11.
Figure 14:
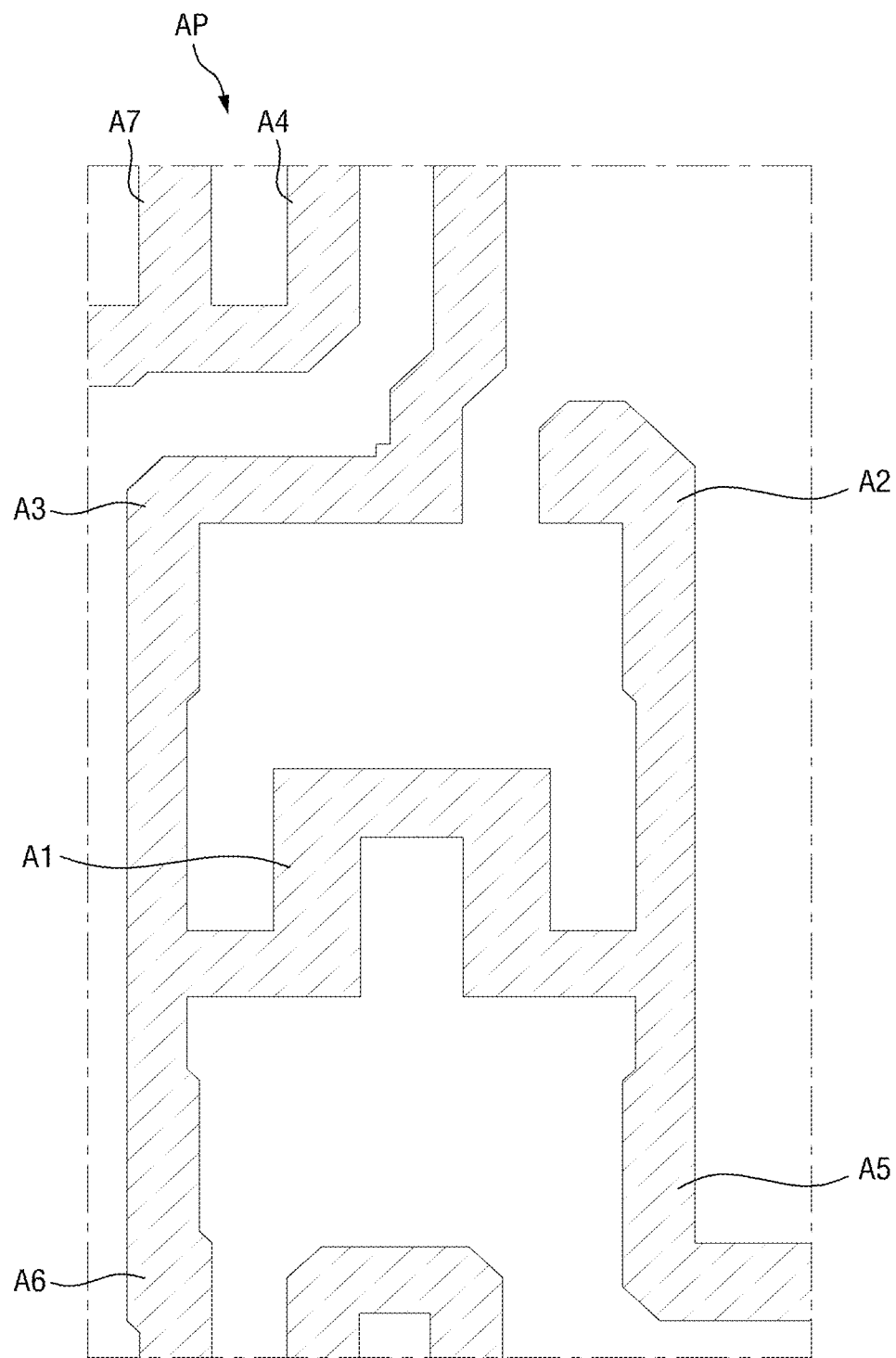
FIG. 14 is a partial, schematic plan view of the semiconductor layer isolated from the other elements of the organic light-emitting display device of FIG. 13.
Figure 15:
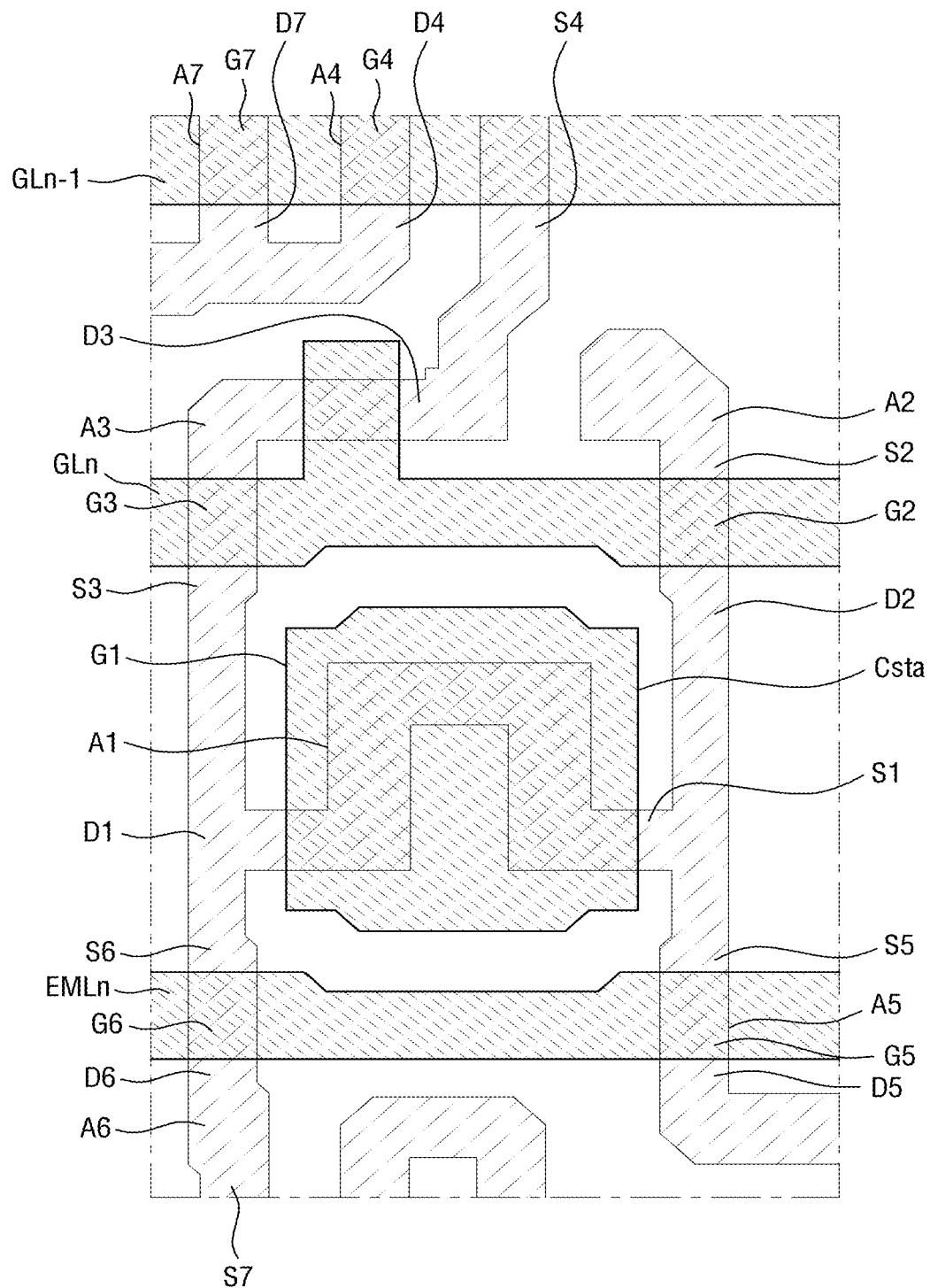
FIG. 15 is a partial, schematic plan view of the gate conductor and the semiconductor layer isolated from the other elements of the organic light-emitting display device of FIG. 13.
Figure 16:
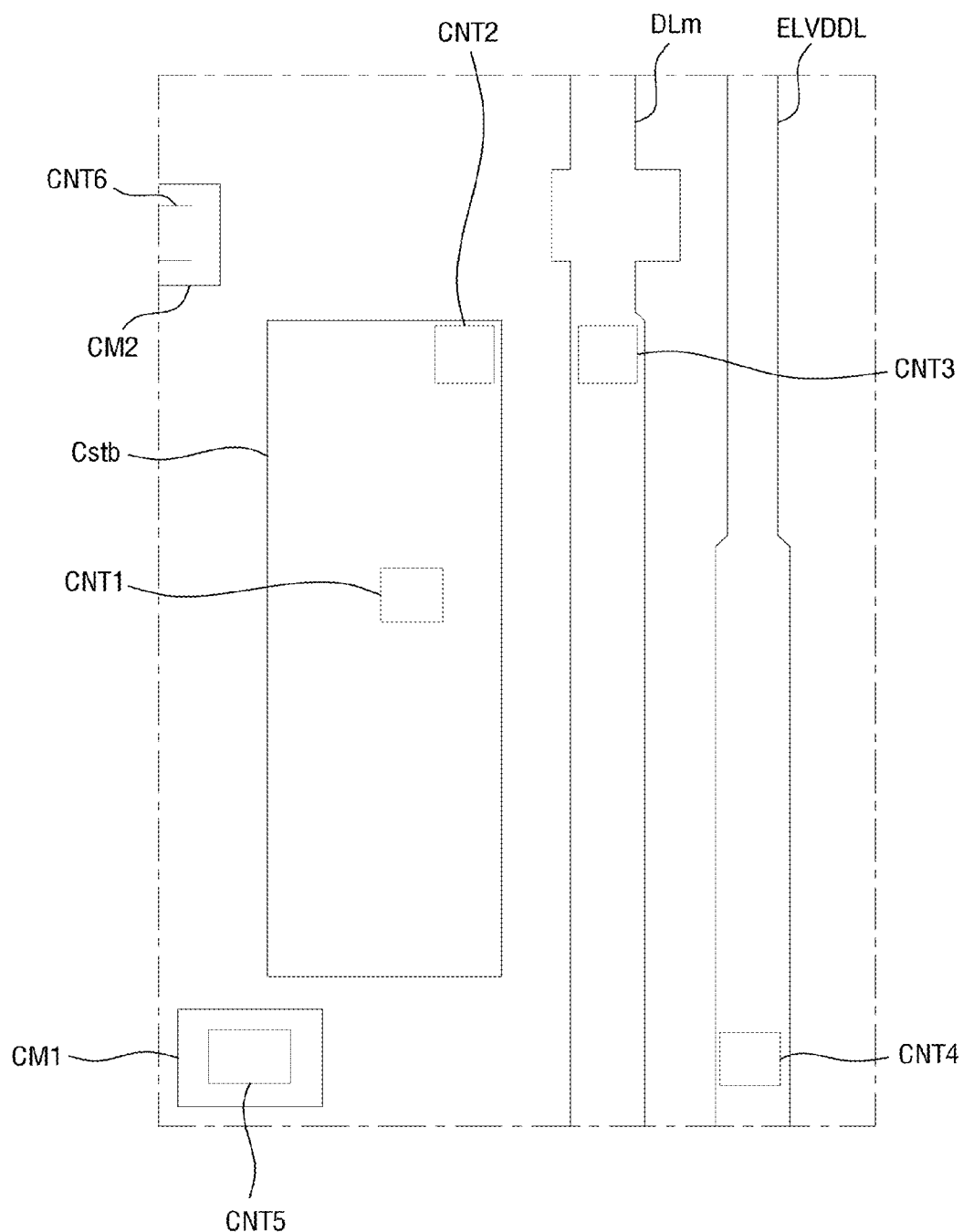
FIG. 16 is a partial, schematic plan view of the data conductor isolated from the other elements of the organic light-emitting display device of FIG. 13.

Referring to FIG. 13, a redundant description of elements and features described above with reference to FIGS. 1 through 12 will be omitted.

Referring to FIGS. 11 and 13, an $n^{th}$ gate line GLn (where n is a natural number of 2 or greater), a $(n-1)^{th}$ gate line GLn−1 and an nth emission control line EMLn may extend in the first direction d1. An mth data line DLm (where m is a natural number of 1 or greater) and a driving voltage line ELVDDL may extend in the second direction d2. The nth gate line GLn, the (n−1)th gate line GLn−1 and the $n^{th}$ emission control line EMLn may be disposed on the same layer as first through seventh gate electrodes G1 through G7. The $m^{th}$ data line DLm and the driving voltage line ELVDDL may be disposed on the same layer according to an embodiment.

A first transistor T1 may include a first semiconductor pattern A1, the first gate electrode G1, a first source electrode S1, and a first drain electrode D1. The first source electrode S1 is a source region doped with impurities in the first semiconductor pattern A1, and the first drain electrode D1 is a drain region doped with impurities in the first semiconductor pattern A1. The first semiconductor pattern A1 may further include a channel region located between the source region and the drain region. The first gate electrode G1 of the first transistor T1 may also perform the function of a first electrode Csta of a storage capacitor Cst which will be described later.

A second transistor T2 may include a second semiconductor pattern A2, the second gate electrode G2, a second source electrode S2 and a second drain electrode D2. The second source electrode S2 is a source region doped with impurities in the second semiconductor pattern A2, and the second drain electrode D2 is a drain region doped with impurities in the second semiconductor pattern A2. The second source electrode S2 of the second transistor T2 may be electrically connected to the $m^{th}$ data line DLm by a third contact hole CNT3. The second drain electrode D2 of the second transistor T2 may be electrically connected to the first transistor T1 and a fifth transistor T5.

A third transistor T3 may include a third semiconductor pattern A3, a third source electrode S2, and a third drain electrode D3. The third source electrode S3 is a source region doped with impurities in the third semiconductor pattern A3, and the third drain electrode D3 is a drain region doped with impurities in the third semiconductor pattern A3. The third gate electrode G3 of the third transistor T3 may be a dual gate electrode formed by a part of the nth gate line GLn and another part protruding from the nth gate line GLn. Accordingly, leakage current can be prevented.

A fourth transistor T4 may include a fourth semiconductor pattern A4, a fourth source electrode S4, and a fourth drain electrode D4. The fourth source electrode S4 is a source region doped with impurities in the fourth semiconductor pattern A4, and the fourth drain electrode D4 is a drain region doped with impurities in the fourth semiconductor pattern A4. The fourth drain electrode D4 of the fourth transistor T4 may be electrically connected to a seventh transistor T7. The fourth source electrode S4 of the fourth transistor T4 may be electrically connected to the first gate electrode G1.

The fifth transistor T5 may include a fifth semiconductor pattern A5, a fifth source electrode S5, and a fifth drain electrode D5. The fifth source electrode S5 is a source region doped with impurities in the fifth semiconductor pattern A5, and the fifth drain electrode D5 is a drain region doped with impurities in the fifth semiconductor pattern A5. The fifth source electrode S5 of the fifth semiconductor pattern A5 may be electrically connected to the driving voltage line ELVDDL by a fourth contact hole CNT4.

A sixth transistor T6 may include a sixth semiconductor pattern A6, a sixth source electrode S6, and a sixth drain electrode D6. The sixth source electrode S6 is a source region doped with impurities in the sixth semiconductor pattern A6, and the sixth drain electrode D6 is a drain region doped with impurities in the sixth semiconductor pattern A6. The sixth drain electrode D6 of the sixth transistor T6 may be electrically connected to a $k^{th}$ pixel electrode PEk by a fifth contact hole CNT5 and a first contact metal CM1.

The seventh transistor T7 may include a seventh semiconductor pattern A7, a seventh source electrode S7, and a seventh drain electrode D7. The seventh source electrode S7 is a source region doped with impurities in the seventh semiconductor pattern A7, and the seventh drain electrode D7 is a drain region doped with impurities in the seventh semiconductor pattern A7. The seventh drain electrode D7 of the seventh transistor T7 may be electrically connected to an initialization voltage line by a sixth contact hole CNT6 and a second contact metal CM2. The seventh source electrode S7 of the seventh transistor T7 may be electrically connected to the $k^{th}$ pixel electrode PEk by the fifth contact hole CNT5 and the first contact metal CM1.

The storage capacitor Cst may include the first electrode Csta and a second electrode Cstb which overlap each other. The first electrode Csta may be directly connected to the first gate electrode G1 and electrically connected to the fourth transistor T4 and the third transistor T3 by the first contact hole CNT1 and the second contact hole CNT2. At least part of the first electrode Csta may overlap the first semiconductor pattern A1. In an embodiment, the second electrode Cstb may be electrically connected to the driving voltage line ELVDDL by a connecting electrode.

The organic light-emitting display device will hereinafter be described in greater detail with reference to FIGS. 13 through 18.

A semiconductor layer AP may be disposed on a buffer layer 120. The semiconductor layer AP may include the first through seventh semiconductor patterns A1 through A7. In an embodiment, the semiconductor layer AP may be made of one or a mixture of at least two of amorphous silicon, polycrystalline silicon, monocrystalline silicon, and low-temperature polycrystalline silicon. In an embodiment, the semiconductor layer AP may include an oxide semiconductor.

A first insulating layer 130 may be disposed on the semiconductor layer AP. The first insulating layer 130 may be stacked on the whole surface of a lower substrate 110 to cover the semiconductor layer AP.

A gate conductor including the $n^{th}$ gate line GLn, the $(n-1)^{th}$ gate line GLn-1, the $n^{th}$ emission control line EMLn, the first electrode Csta of the storage capacitor Cst, and the first through seventh gate electrodes G1 through G7 may be disposed on the first insulating layer 130. The elements of the gate conductor may be formed at the same time by the same mask process.

A second insulating layer 140 may be disposed on the gate conductor.

A data conductor including the $m^{th}$ data line DLm, the driving voltage line ELVDDL, the first through seventh source electrodes S1 through S7, the first through seventh drain electrodes D1 through D7, and the second electrode Cstb of the storage capacitor Cst may be disposed on the second insulating layer 140.

In an embodiment, the $m^{th}$ data line DLm may include a first data layer, a second data layer, and a data insulating layer disposed between the first data layer and the second data layer. The first and second data layers may be made of a conductive material, and the data insulating layer may be made of an insulating material. The first and second data layers may be electrically connected to each other by a first via hole Via1 and a third contact metal CM3. More specifically, the third contact metal CM3 may be disposed in the first via hole Via1. The third contact metal CM3 may be directly connected to both the first data layer and the second data layer. Accordingly, resistance components of the $m^{th}$ data line DLm can be reduced. However, the structure of the $m^{th}$ data line DLm is not limited to the multilayer structure, and the $m^{th}$ data line DLm may also be formed as a single layer. In addition, the driving voltage line ELVDD may also have a multilayer structure composed of a plurality of layers and an insulating layer interposed between the layers in order to reduce resistance components of the driving voltage line ELVDDL.

A overcoat layer 150 may be disposed on the data conductor.

The $k^{th}$ pixel electrode PEk may be disposed on the overcoat layer 150. The $k^{th}$ pixel electrode PEk may be electrically connected to the sixth drain electrode D6 of the sixth transistor T6 by the fifth contact hole CNT5 and the first contact metal CM1.

The $k^{th}$ pixel electrode PEk may overlap a first conductive line and a second conductive line. Here, an embodiment of the first conductive line may be the $m^{th}$ data line DLm, and an embodiment of the second conductive line may be the driving voltage line ELVDDL. Hereinafter, the first conductive line will be described as the $m^{th}$ data line DLm, and the second conductive line will be described as the driving voltage line ELVDDL.

Figure 17:
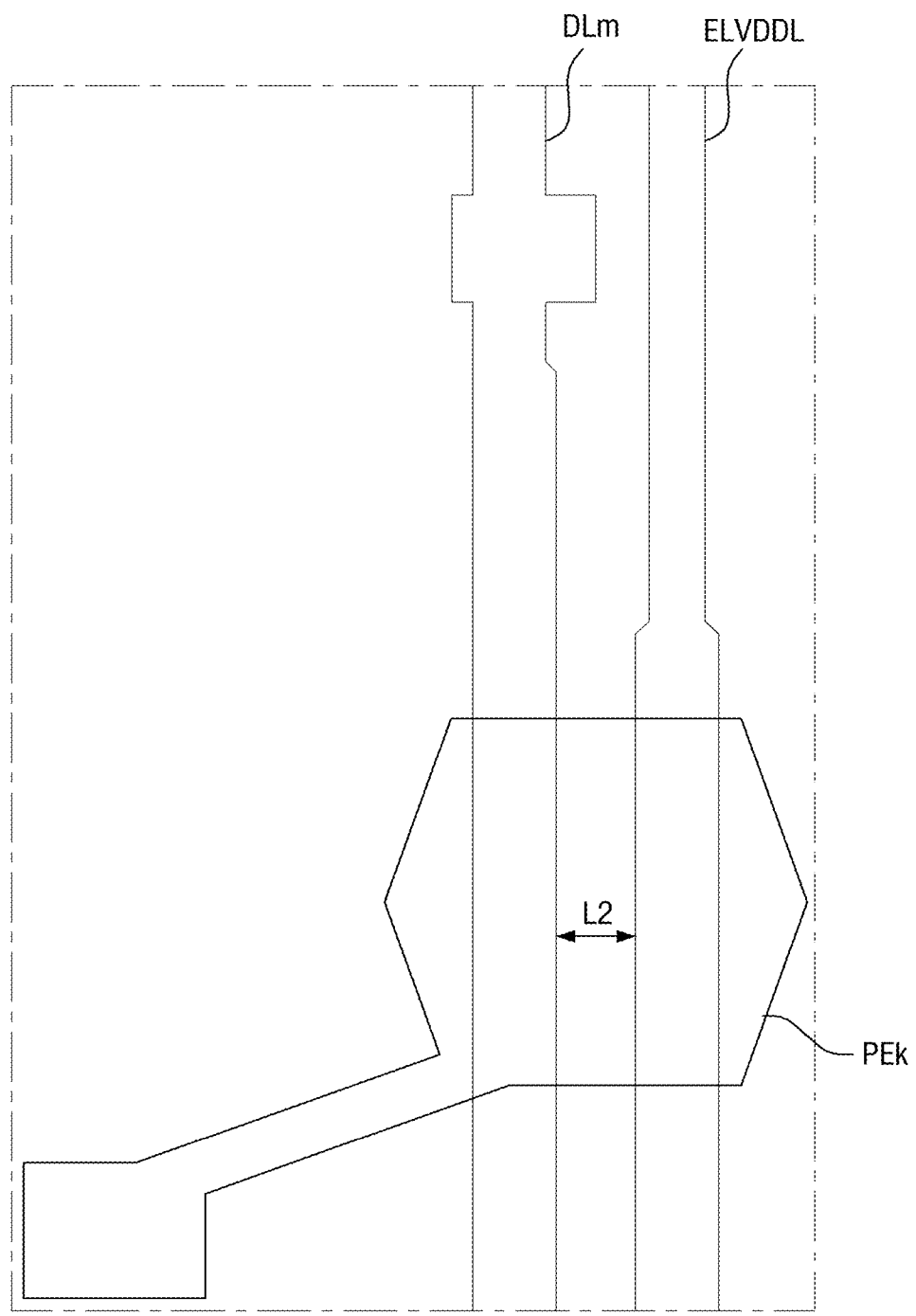
FIG. 17 is a schematic plan view of the $k^{th}$ pixel electrode, $m^{th}$ data line and driving voltage line isolated from the other elements of the organic light-emitting display device of FIG. 13.
Figure 18:
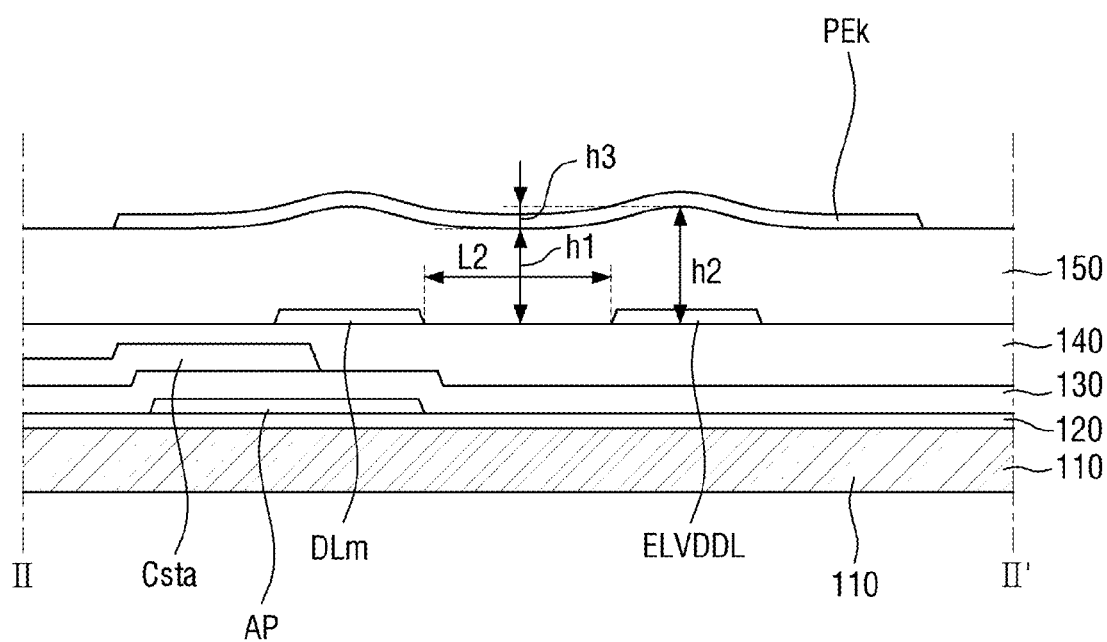
FIG. 18 is a cross-sectional side view taken along the line II-II' of FIG. 13.

Referring to FIGS. 17 and 18, the $m^{th}$ data line DLm may be disposed on the same layer as the driving voltage line ELVDDL and may be insulated from the driving voltage line ELVDDL. The $m^{th}$ data line DLm and the driving voltage line ELVDDL may overlap the $k^{th}$ pixel electrode PEk.

A distance L2 between the $m^{th}$ data line DLm and the driving voltage line ELVDDL may be greater than about 10 μm. However, to minimize a coupling phenomenon between the $m^{th}$ data line DLm and the driving voltage line ELVDDL, the distance L2 between the $m^{th}$ data line DLm and the driving voltage line ELVDDL may be about 5 to 10 μm. Hereinafter, the distance L2 between the two lines will be described as being about 5 to 10 μm.

The overcoat layer 150 may have a first thickness h1 and a second thickness h2. The second thickness h2 of the overcoat layer 150 may be different from the first thickness h1. A step difference h3 of the overcoat layer 150 which is defined as a difference between the first thickness h1 and the second thickness h2 may be about 70 nm or less.

The first thickness h1 of the overcoat layer 150 may be about 1.5 to 2.0 μm. The second thickness h2 of the overcoat layer 150 is not limited to a particular thickness as long as the step difference h3 of the overcoat layer 150 is about 70 μm or less.

Accordingly, the kth pixel electrode PEk disposed on the overcoat layer 150 may have a step difference of about 70 μm or less, corresponding to a relatively uniform flatness. Hence, the color separation phenomenon due to external light can be improved in a plurality of pixels including the first pixel PX1, which, in turn, improves the separation of reflected color. Further, since a polarizing plate required to prevent introduction of external light can be omitted from the organic light-emitting display device constructed according to the principles of the invention, product production costs due to this plate can be saved.

Figure 19:
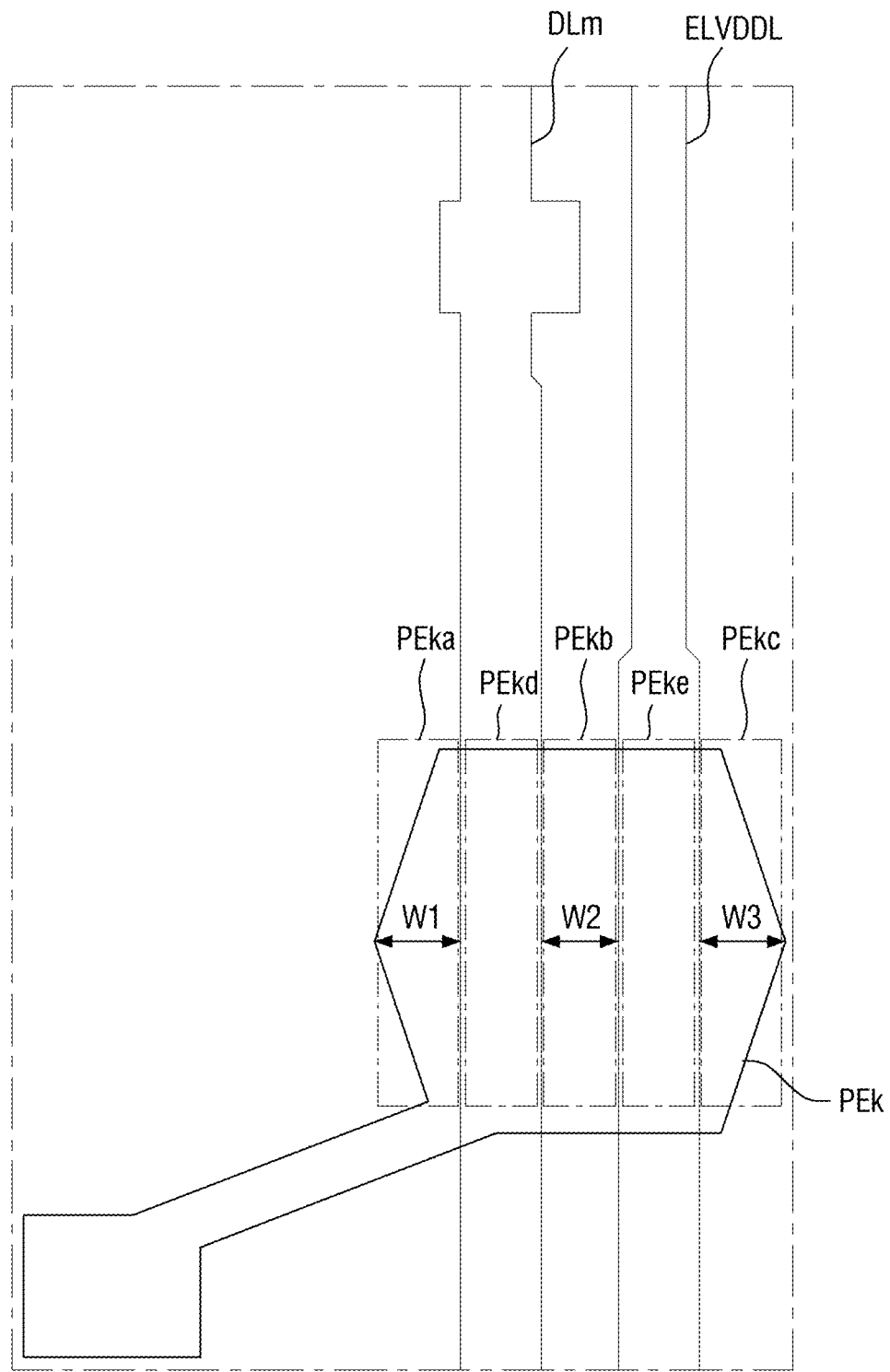
FIG. 19 is a schematic plan view of the kth pixel electrode, mth data line and driving voltage line isolated from the other elements of the organic light-emitting display device of FIG. 13, and emphasizing the features differently than FIG. 17.
Figure 20:
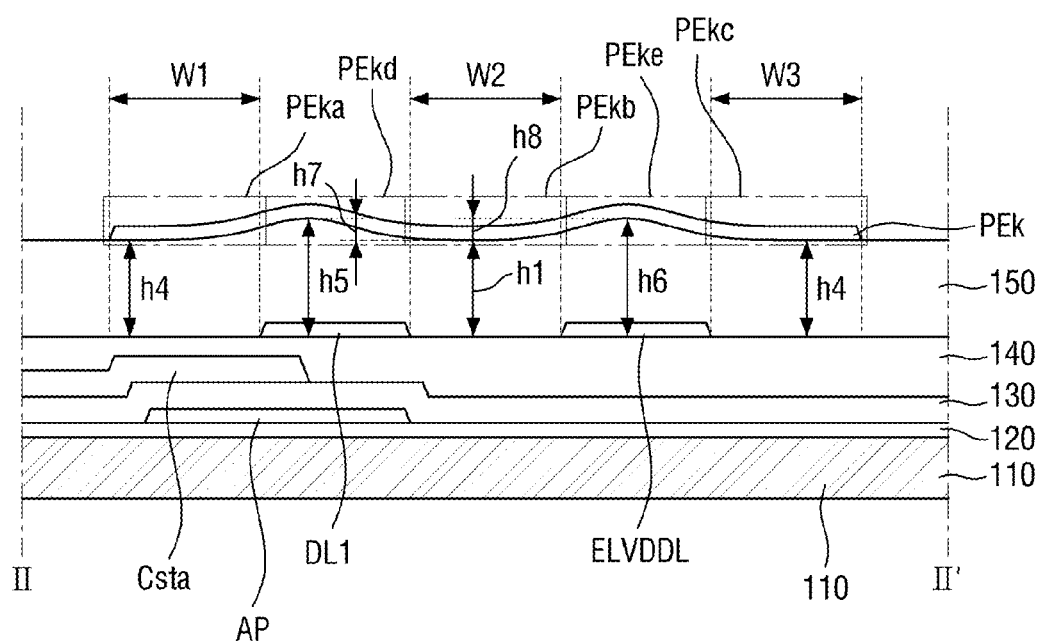
FIG. 20 is a cross-sectional side view taken along the line II-II' of FIG. 13 and emphasizing the features differently than FIG. 18.
Figure 21:
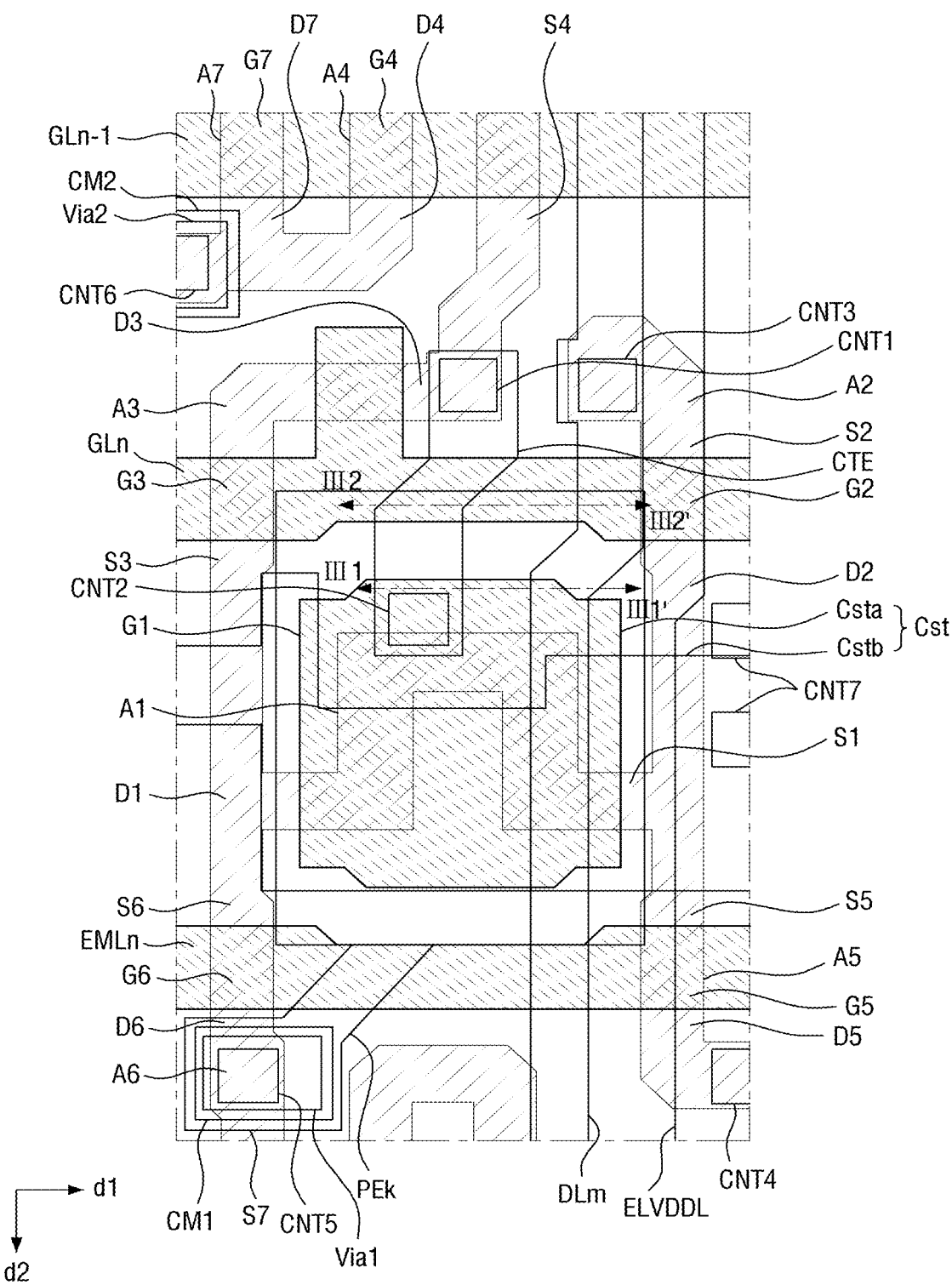
FIG. 21 is a schematic plan view of a pixel of a seventh embodiment of an organic light-emitting display device constructed according to the principles of the invention.
Figure 22:
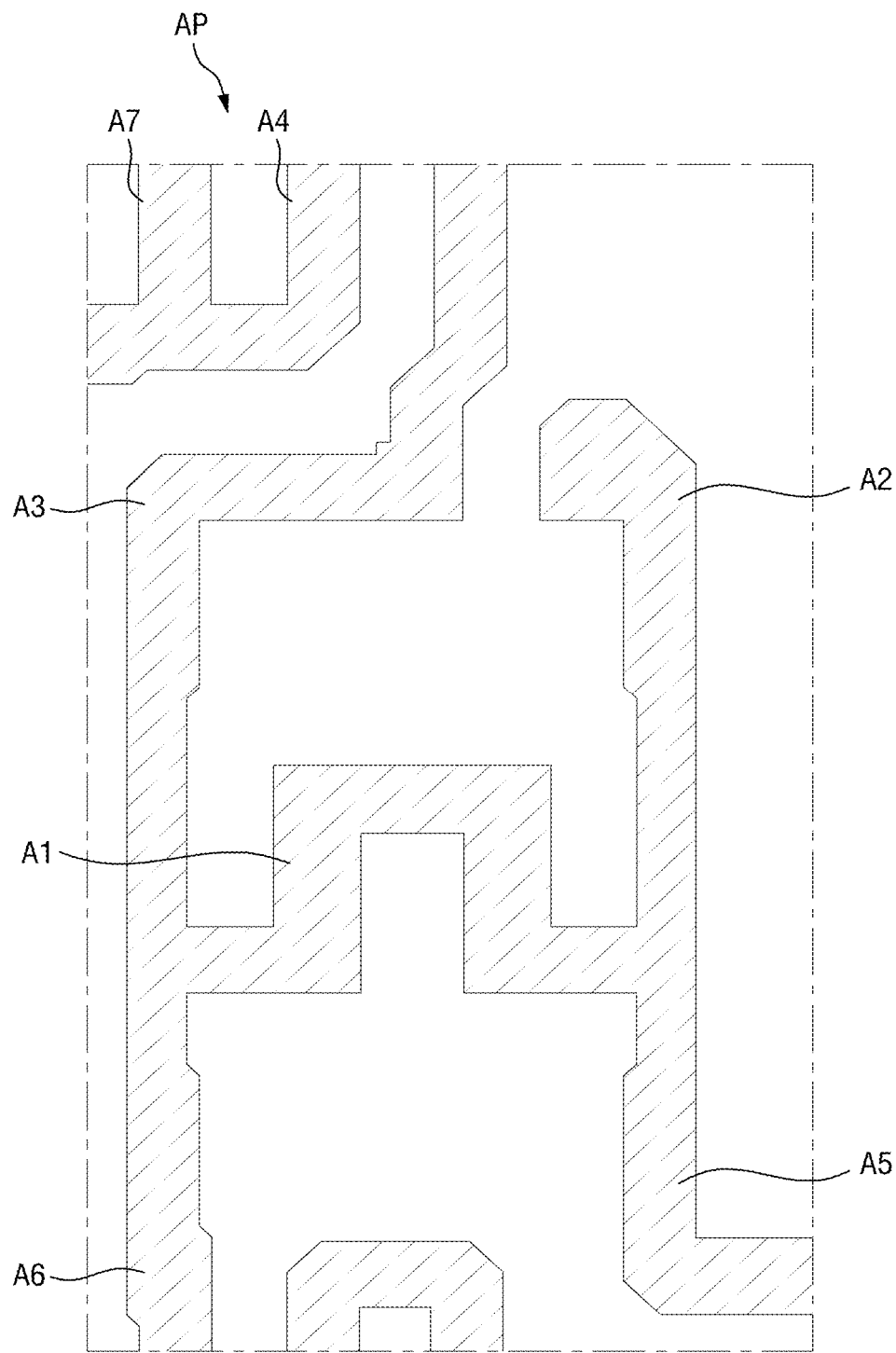
FIG. 22 is a partial, schematic plan view of the semiconductor layer isolated from the other elements of the organic light-emitting display device of FIG. 21.
Figure 23:
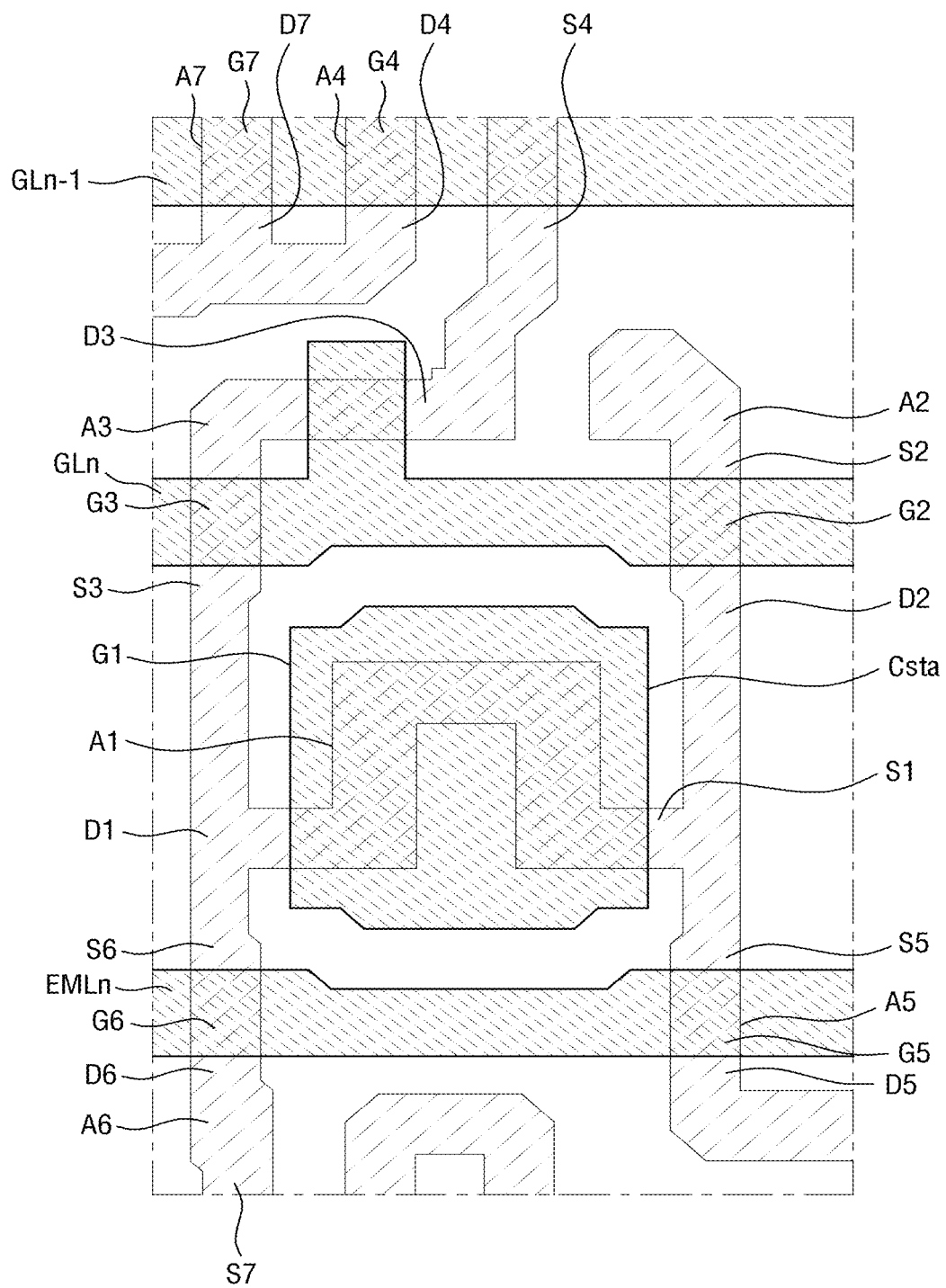
FIG. 23 is a partial, schematic plan view of the gate conductor and the semiconductor layer isolated from the other elements of the organic light-emitting display device of FIG. 21.
Figure 24:
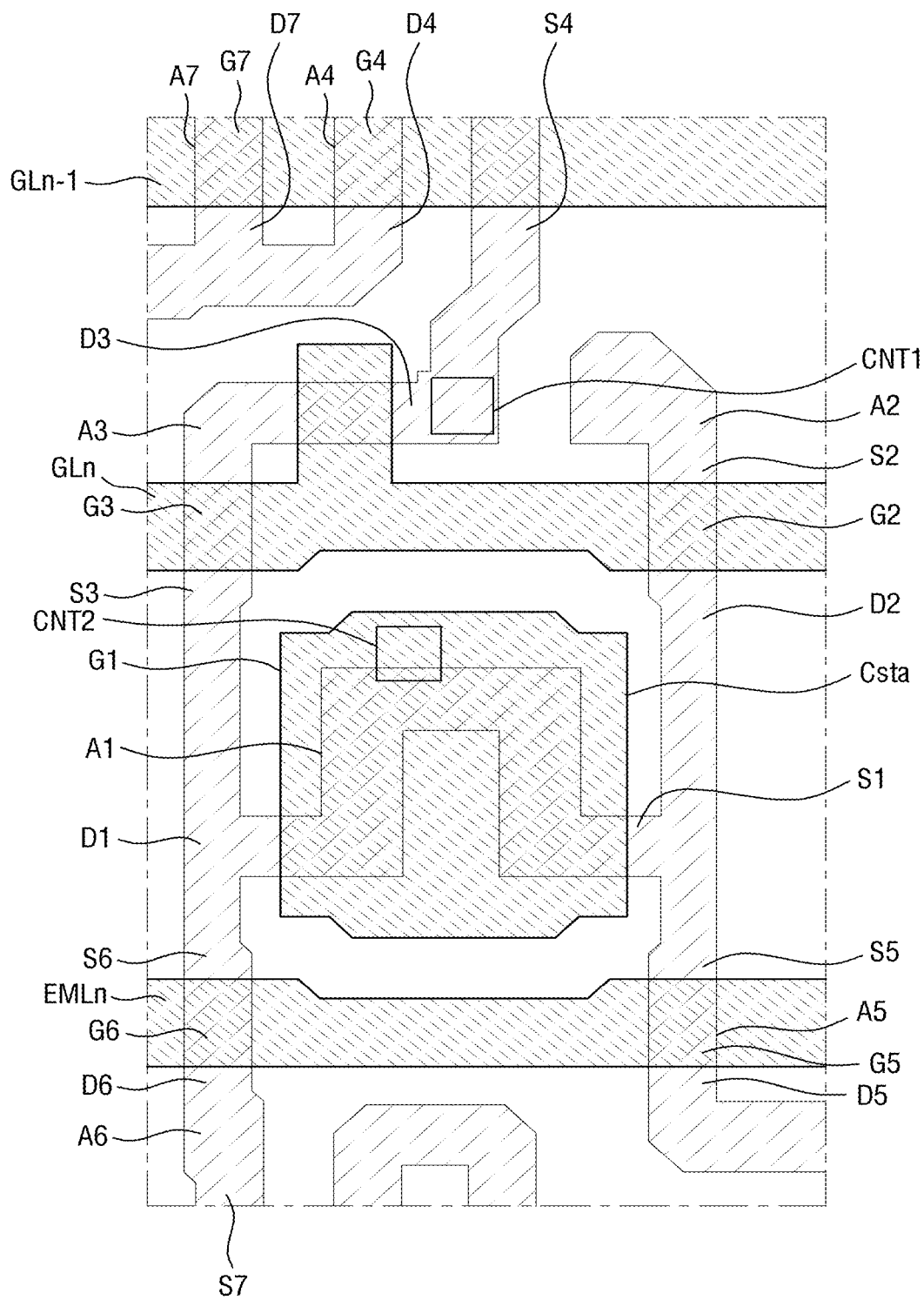
FIG. 24 is a partial, schematic plan view of first and second contact holes in addition to the elements of FIG. 23, isolated from the other elements of the organic light-emitting display of FIG. 21.
Figure 25:
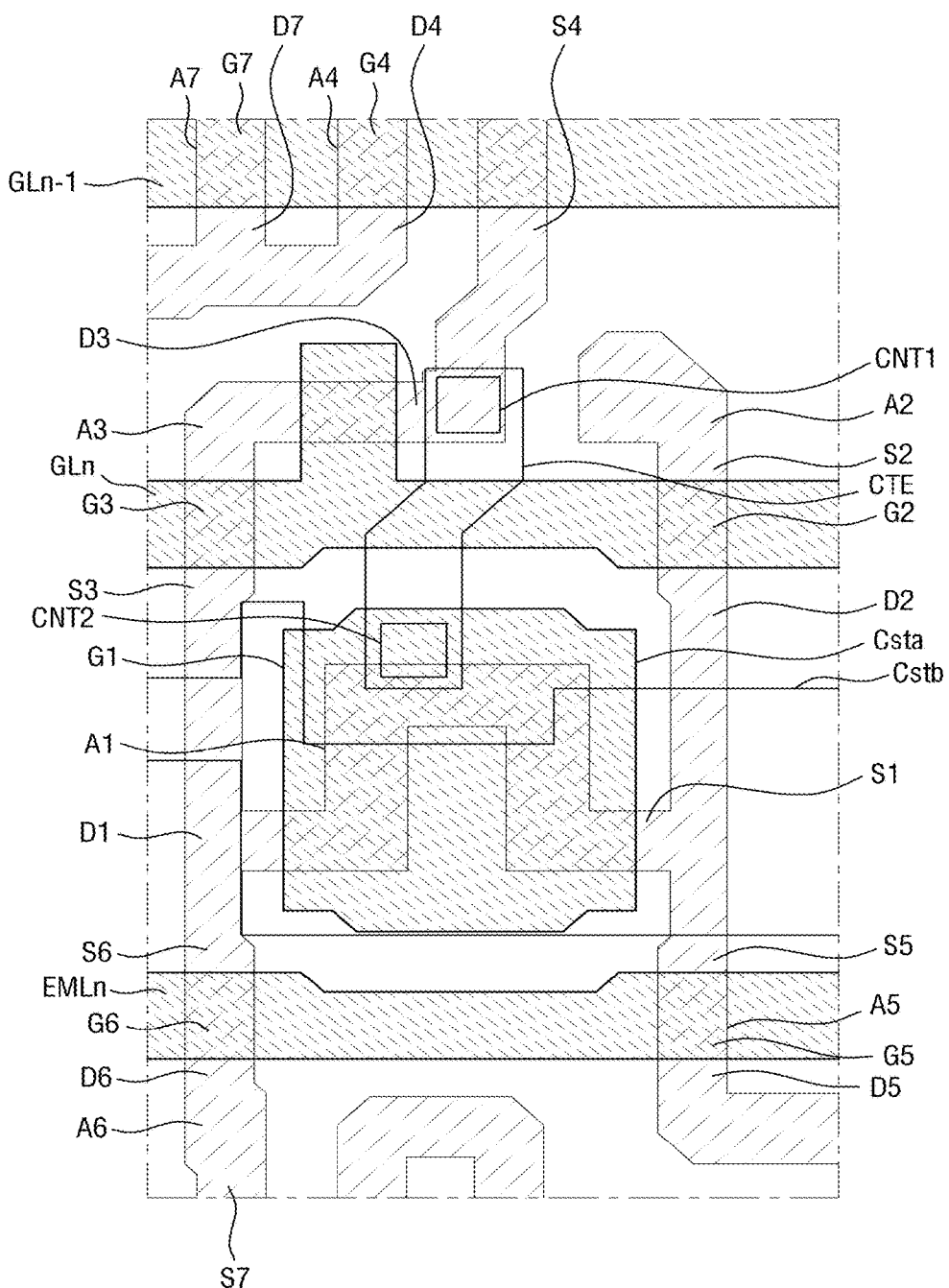
FIG. 25 is a partial, schematic plan view of a connecting electrode in addition to the elements of FIG. 24, isolated from the other elements of the organic light-emitting display of FIG. 21.
Figure 26:
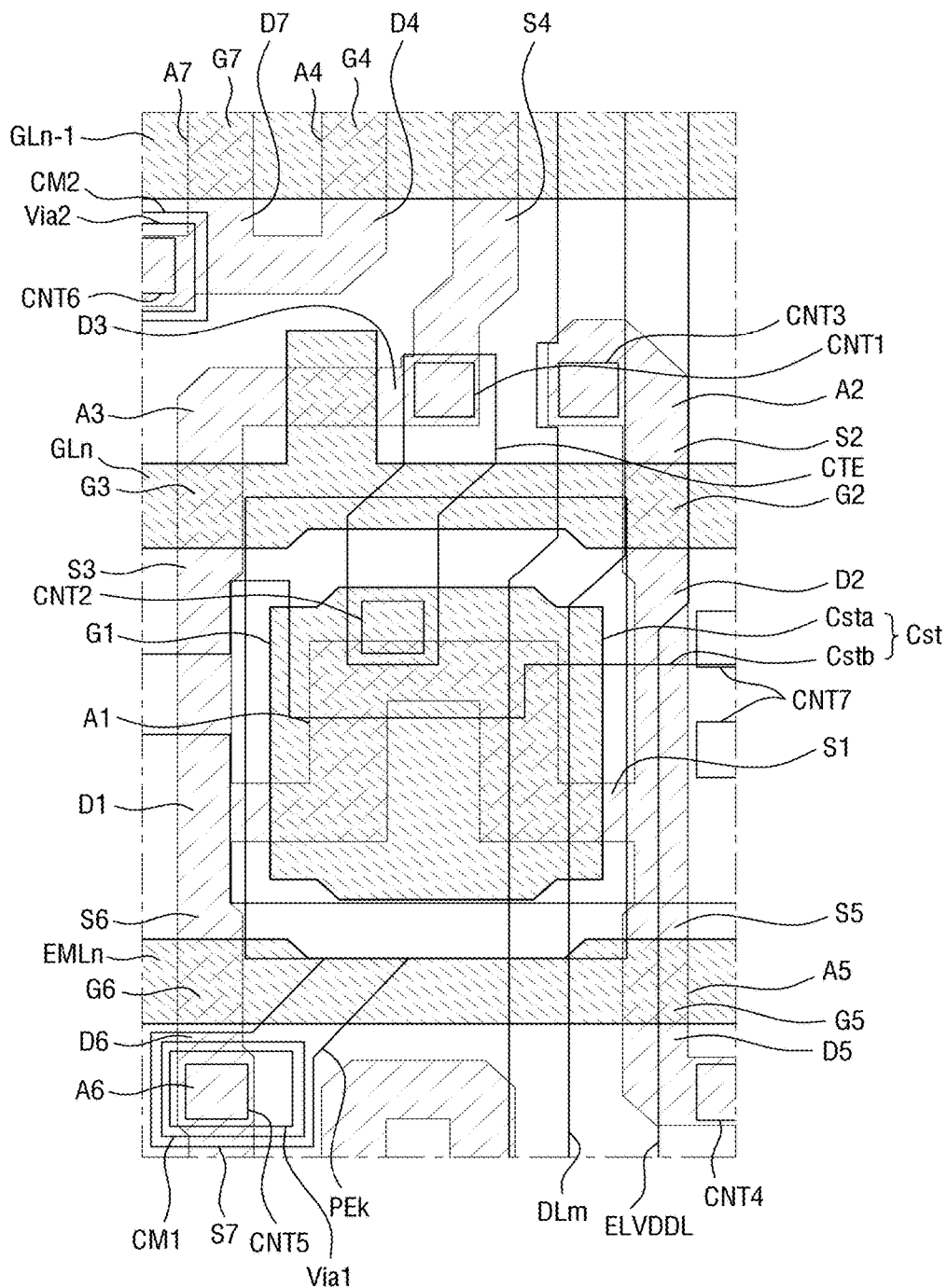
FIG. 26 is a partial, schematic plan view of a data conductor and a $k^{th}$ pixel electrode in addition to the elements of FIG. 25, isolated from the other elements of the organic light-emitting display of FIG. 21.

Referring to FIG. 19 and FIG. 20, a redundant description of elements and features described above with reference to FIGS. 13 through 18 will be omitted.

A kth pixel electrode PEk may include a first area PEka, a second area PEkb, and a third area PEkc. The first area PEka may be disposed on a side of an mth data line DLm, and the second area PEkb may be disposed on the other side of the $m^{th}$ data line DLm and on a side of a driving voltage line ELVDDL. The third area PEkc may be disposed on the other side of the driving voltage line ELVDDL.

Here, a width W1 of the first area PEka, a width W2 of the second area PEkb and a width W3 of the third area PEkc may be substantially equal. That is, the $k^{th}$ pixel electrode PEk may be split into the first through third areas PEka through PEkc having equal widths by the $m^{th}$ data line DLm and the driving voltage line ELVDDL.

The $k^{th}$ pixel electrode PEk may further include a fourth area PEkd disposed between the first area PEka and the second area PEkb and a fifth area PEke disposed between the second area PEkb and the third area PEkc.

An overcoat layer 150 may have third through fifth thicknesses h4 through h6. The fourth thickness h5 and the fifth thickness h6 of the overcoat layer 150 may be equal or different. The fourth thickness h5 and the fifth thickness h6 of the overcoat layer 150 may be different from the third thickness h4. A distance between a first data line DL1 and the driving voltage line ELVDDL may be substantially equal to the width W2 of the second area PEkb.

The second area PEkb may have a width of about 5 to 10 μm.

A first step difference h7 of the overcoat layer 150 which is defined as a difference between the third thickness h4 and the fourth thickness h5 is about 70 nm or less. In addition, a second step difference h8 of the overcoat layer 150 which is defined as a difference between the third thickness h4 and the fifth thickness h6 may be about 1.5 to 2.0 μm. The fourth thickness h5 and the fifth thickness h6 of the overcoat layer 150 are not limited to particular thicknesses as long as the first step difference h7 and the second step difference h8 are about 70 nm or less.

The first step difference h7 and the second step difference h8 of the overcoat layer 150 may vary according to the thicknesses, widths, etc. of the first data line DL1 and the driving voltage line ELVDDL but may both be about 70 nm or less.

Therefore, the $k^{th}$ pixel electrode PEk disposed on the overcoat layer 150 may have a step difference of about 70 nm or less in all areas. Accordingly, the color separation phenomenon due to external light can be improved in a plurality of pixels including the $k^{th}$ pixel PXk.

Referring to FIG. 21 through FIG. 28, the kth pixel electrode PEk may overlap a first conductive line and a second conductive line. Here, an embodiment of the first conductive line may be the connecting electrode CTE, and an embodiment of the second conductive line may be the $m^{th}$ data line DLm. Hereinafter, the first conductive line will be described as the connecting electrode CTE, and the second conductive line will be described as the $m^{th}$ data line DLm.

Figure 27:
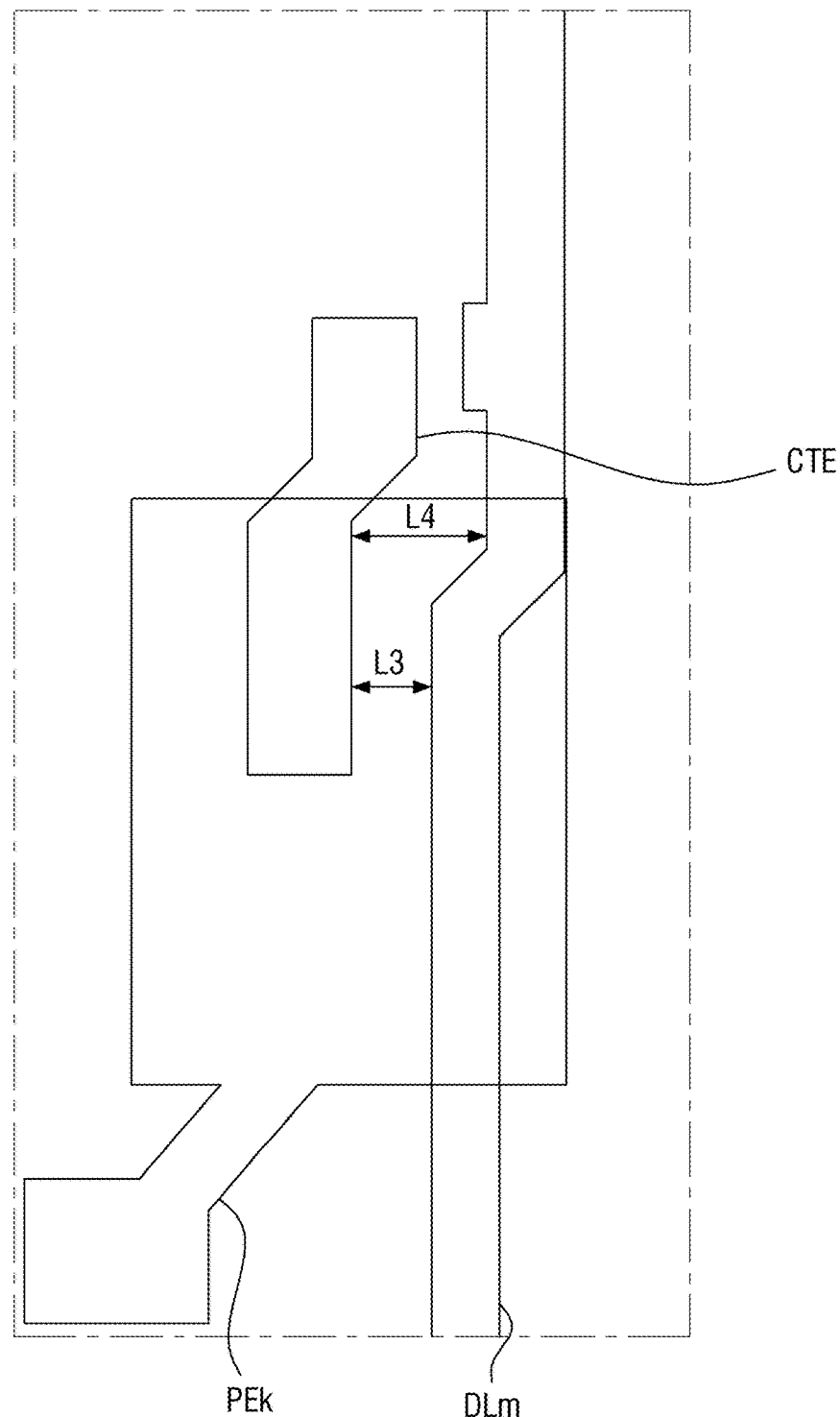
FIG. 27 is a schematic plan view of the $k^{th}$ pixel electrode, an $m^{th}$ data line, and the connecting electrode isolated from the other elements of the organic light-emitting display device of FIG. 21.

The connecting electrode CTE and the $m^{th}$ data line DLm may be disposed on different layers. Referring to FIG. 27, when seen from above, a minimum distance L3 between the connecting electrode CTE and the $m^{th}$ data line DLm may be about 5 μm, and a maximum distance L4 between the connecting electrode CTE and the $m^{th}$ data line DLm may be about 5 to 10 μm. That is, the distance between the connecting electrode CTE and the $m^{th}$ data line DLm may be about 5 to 10 μm.

The organic light-emitting display device will hereinafter be described in greater detail with reference to FIGS. 21 through 28. Any redundant description will be omitted.

Referring to FIGS. 21 through 28, a fourth source electrode S4 of a fourth transistor T4 may be electrically connected to a first gate electrode G1 of a first transistor T1 by the connecting electrode CTE.

The connecting electrode CTE may generally extend along the second direction d2. The connecting electrode CTE is disposed on a different layer from the $m^{th}$ data line DLm. That is, a third insulating layer 141 is further disposed between the $m^{th}$ data line DLm and the connecting electrode CTE. The connecting electrode CTE may electrically connect the fourth transistor T4 and the first transistor T1 through the first and second contact holes CNT1 and CNT2.

A first electrode Csta of a storage capacitor Cst may be electrically connected to the fourth transistor T4 by the connecting electrode CTE which is connected to the first electrode Csta by the second contact hole CNT2. A second electrode Cstb of the storage capacitor Cst may be disposed on the same layer as the connecting electrode CTE. An end of the connecting electrode CTE may be electrically connected to the fourth transistor T4 by the first contact hole CNT1, and the other end of the connecting electrode CTE may be electrically connected to the first electrode Csta of the storage capacitor Cst by the second contact hole CNT2.

The $k^{th}$ pixel electrode PEk may at least partially overlap the first transistor T1, the storage capacitor Cst, and the connecting electrode CTE. The $k^{th}$ pixel electrode PEk may be electrically connected to a sixth transistor T6 by a first via hole Via1. The shape of the $k^{th}$ pixel electrode PEk is not limited to the shape illustrated in the drawings.

Since the connecting electrode CTE is disposed at a lower level than the $m^{th}$ data line DLm, as will be discussed in greater detail below, stains or a color deviation phenomenon caused by parasitic capacitance generated when the connecting electrode CTE and the $m^{th}$ data line DLm are disposed on the same layer can be improved.

Figure 28:
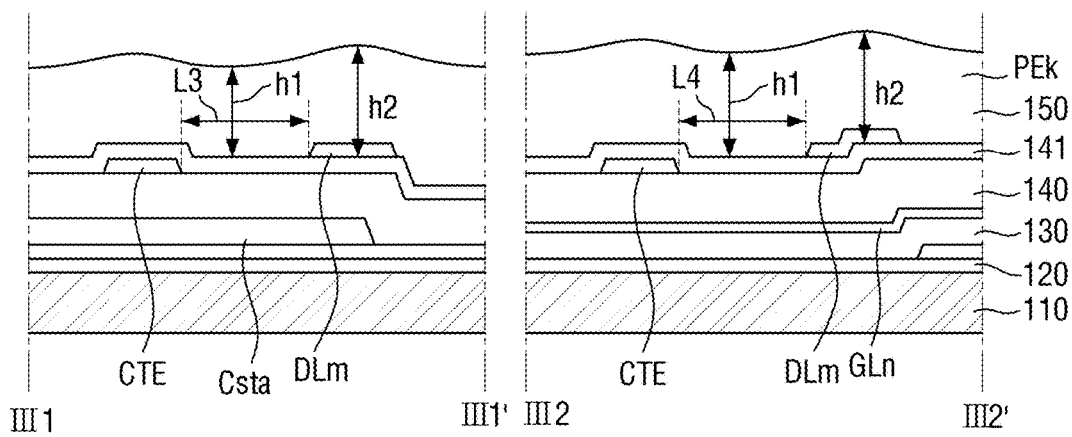
FIG. 28 is a broken cross-sectional side view taken along the lines III1-III1' and III2-III2' of FIG. 21.

Referring to FIGS. 27 and 28, the $m^{th}$ data line DLm is disposed on a different layer from the connecting electrode CTE. In an embodiment, a minimum distance L3 between the $m^{th}$ data line DLm and the connecting electrode CTE may be about 5 μm when seen from above based on FIG. 27. Unlike the illustration in FIG. 27, the minimum distance L3 may also be 0 μm. In addition, in an embodiment, a maximum distance L4 between the $m^{th}$ data line DLm and the connecting electrode CTE may be about 10 μm when seen from above, a view represented in FIG. 27.

That is, the distance between the $m^{th}$ data line DLm and the connecting electrode CTE may be about 0 to 10 μm when seen from above as in FIG. 27.

A first thickness h1 of a overcoat layer 150 is a minimum distance from an upper surface of the third insulating layer 141 to an upper surface of the overcoat layer 150 in a first pixel area GA1. A second thickness h2 of the overcoat layer 150 is a maximum distance from the upper surface of the third insulating layer 141 to the upper surface of the overcoat layer 150 in a $k^{th}$ pixel area GAk.

Here, a step difference h3 of the overcoat layer 150 which is defined as a difference between the first thickness h1 and the second thickness h2 of the overcoat layer 150 is about 70 nm or less. The first thickness h1 of the overcoat layer 150 may be about 1.5 to 2.0 μm. The second thickness h2 of the overcoat layer 150 is not limited to a particular thickness as long as the step difference h3 of the overcoat layer 150 is about 70 nm or less.

Accordingly, the $k^{th}$ pixel electrode PEk disposed on the overcoat layer 150 may have a step difference of about 70 μm or less, thus securing uniform flatness.

Figure 29:
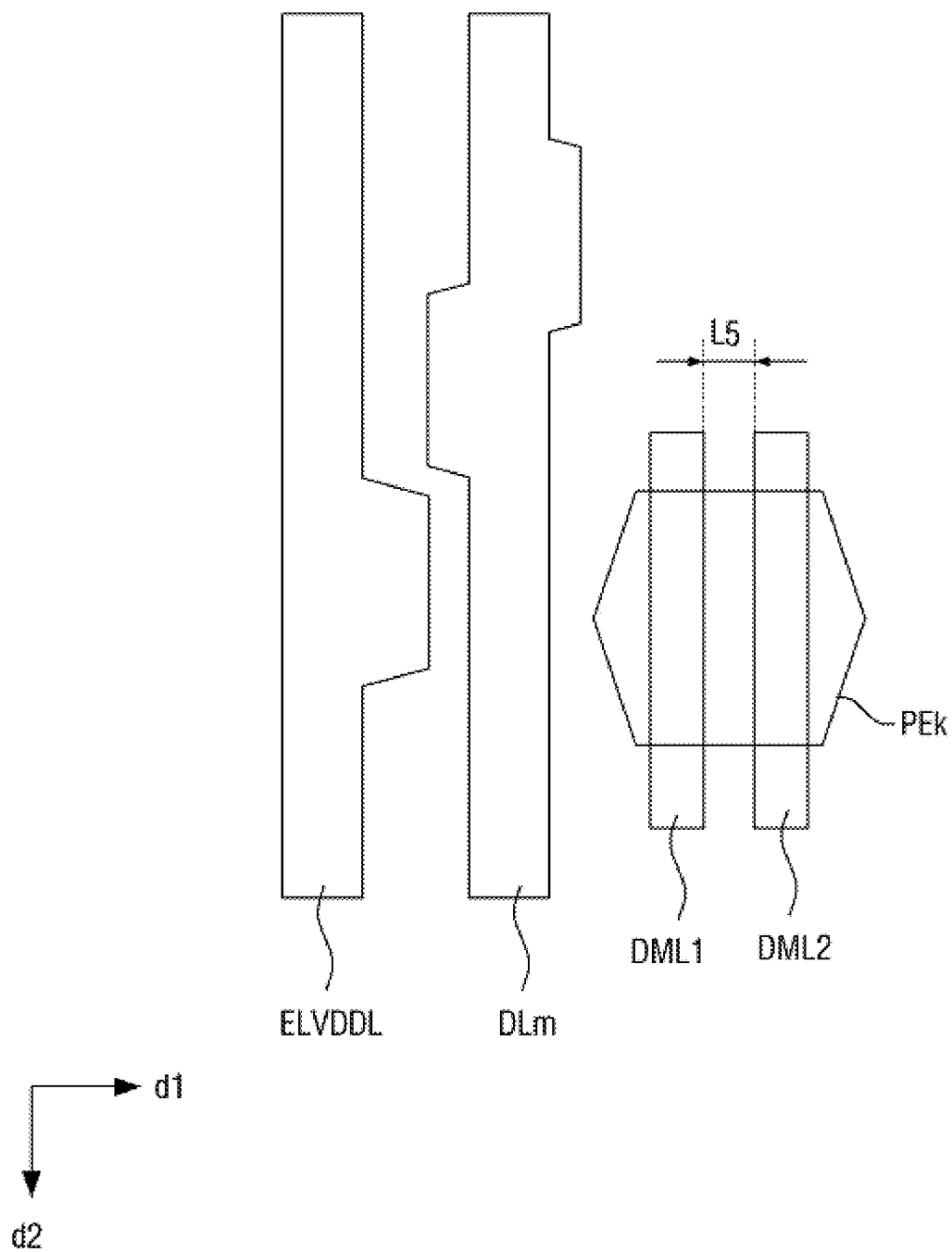
FIG. 29 is a plan view of selected elements of an organic light-emitting display device constructed according to the principles of the invention.
Figure 30:
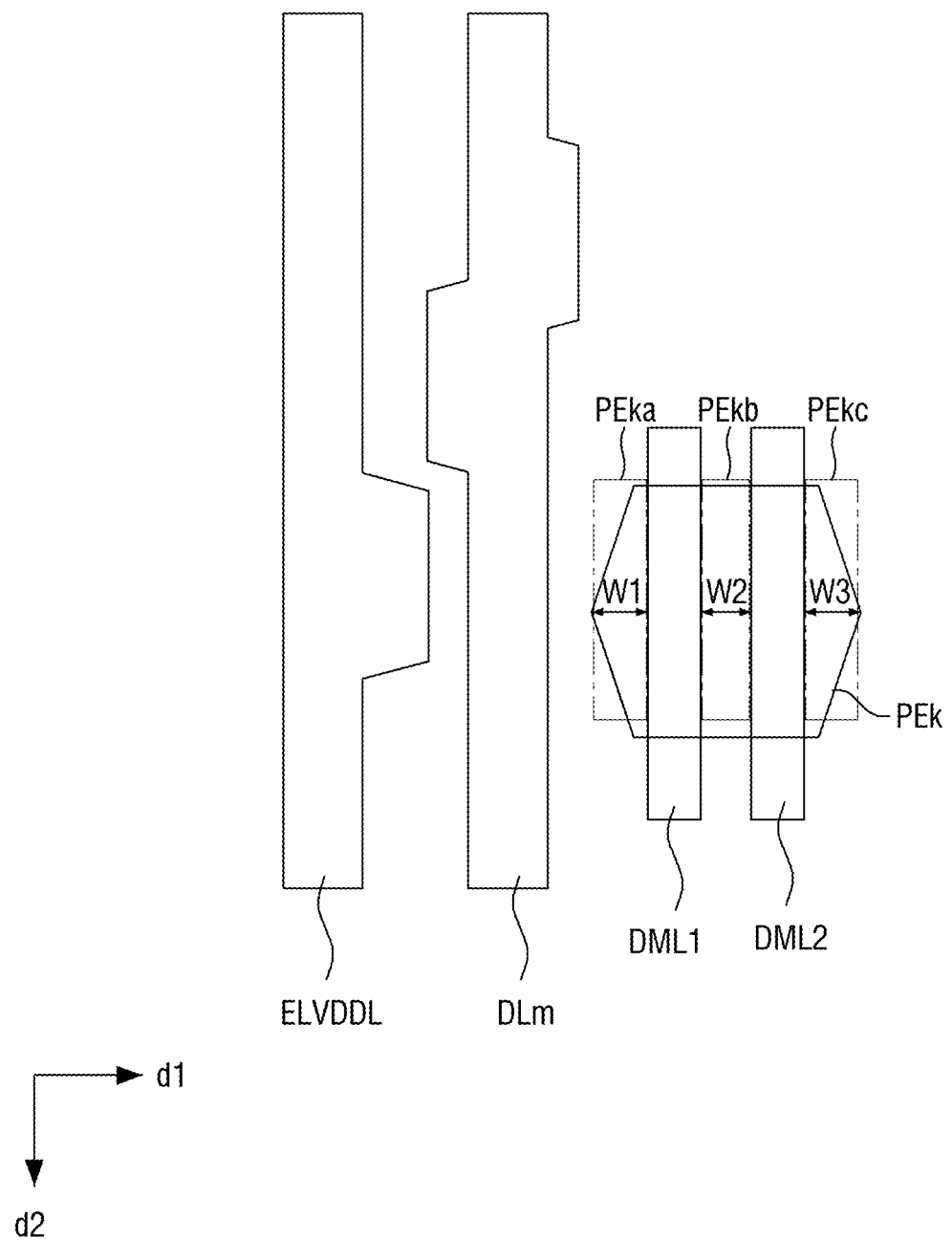
FIG. 30 is a plan view of the elements shown in FIG. 29 with different points of emphasis.

In FIGS. 29 and 30, only some elements are illustrated for ease of description. Therefore, the shapes of the elements illustrated in FIGS. 29 and 30, the distance between the elements and the positional relationships among the elements can be changed by other elements.

Referring first to FIG. 29, a driving voltage line ELVDDL and an $m^{th}$ data line DLm may be disposed on the same layer according to an embodiment. Alternatively, the driving voltage line ELVDDL and the $m^{th}$ data line DLm may be disposed on different layers. The driving voltage line ELVDDL and the $m^{th}$ data line DLm may extend along the second direction d2 and may be insulated from each other. In some other embodiments, the driving voltage line ELVDDL and the $m^{th}$ data line DLm may extend in the first direction d1.

The organic light-emitting display device according to the embodiment may further include first and second dummy lines DML1 and DML2. In some embodiments, the first and second dummy lines DML1 and DML2 may extend along the second direction d2. In some other embodiments, the first and second dummy lines DML1 and DML2 may extend along the first direction d1. The first and second dummy lines DML1 and DML2 may extend in the same direction as the driving voltage line ELVDDL and the $m^{th}$ data line DLm or may extend in a different direction from the driving voltage line ELVDDL and the $m^{th}$ data line DLm. The first and second dummy lines DML1 and DML2 may be floating electrodes to which no voltage is applied from an external source.

The first and second dummy lines DML1 and DML2 overlap a $k^{th}$ pixel electrode PEk. The $k^{th}$ pixel electrode PEk may be disposed on the first and second dummy lines DML1 and DML2. In an embodiment, an overcoat layer may be disposed between the first and second dummy lines DML1 and DML2 and the $k^{th}$ pixel electrode PEk.

A distance L5 between the first and second dummy lines DML1 and DML2 may be about 5 to 10 μm.

Accordingly, a step difference of the overcoat layer which is defined as a difference between a highest area and a lowest area of the overcoat layer may be about 70 nm or less.

Therefore, the $k^{th}$ pixel electrode PEk disposed on the overcoat layer may be sufficiently flat to sufficiently minimize the undesirable separation of reflected color.

Referring to FIG. 30, a $k^{th}$ pixel electrode PEk may include a first area PEka, a second area PEkb, and a third area PEkc. The first area PEka may be disposed on a side of a first dummy line DML1, and the second area PEkb may be disposed on the other side of the first dummy line DML1 and on a side of a second dummy line DML2. The third area PEkc may be disposed on the other side of the second dummy line DML2.

Here, a width W1 of the first area PEka, a width W2 of the second area PEkb and a width W3 of the third area PEkc may be substantially equal. That is, the $k^{th}$ pixel electrode PEk may be split into the first through third areas PEka through PEkc having equal widths by the first and second dummy lines DML1 and DML2.

A distance between the first and second dummy lines DML1 and DML2 may be substantially equal to the width W2 of the second area PEkb. The second area PEkb may have a width of about 5 to 10 μm. An overcoat layer is disposed between the first and second dummy lines DML1 and DML2 and the $k^{th}$ pixel electrode PEk. A step difference of the overcoat layer may be about 70 nm or less. Therefore, the color separation phenomenon due to external light can be improved in a plurality of pixels including the $k^{th}$ pixel PEk.

An organic light-emitting display device according to an embodiment can reduce the undesirable separation of reflected color.

In addition, production cost can be reduced as described in greater detail above.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. An organic light-emitting display device comprising:
   a substrate;
   a first conductive line disposed on the substrate;
   a second conductive line disposed on the same layer as the first conductive line and insulated from the first conductive line; and
   a pixel electrode disposed on the first and second conductive lines overlapping the first and second conductive lines,
   wherein:
   a distance between the first conductive line and the second conductive line is about 0 to 10 μm; and
   a difference between a minimum distance from an upper surface of the substrate to a lower surface of the pixel electrode and a maximum distance from the upper surface of the substrate to the lower surface of the pixel electrode is about 70 nm or less.

2. The display device of claim 1, further comprising:
   an insulating layer which is disposed between the first and second conductive lines and the substrate; and
   a overcoat layer which is disposed between the first and second conductive lines and the pixel electrode and has a first thickness and a second thickness,
   wherein the first thickness of the overcoat layer is defined as a minimum distance from an upper surface of the insulating layer to an upper surface of the overcoat layer, and the second thickness of the overcoat layer is defined as a maximum distance from the upper surface of the insulating layer to the upper surface of the overcoat layer, wherein a difference between the first thickness and the second thickness is about 70 nm or less.

3. The display device of claim 2, wherein the first thickness of the overcoat layer is about 1.5 to 2.0 μm.

4. The display device of claim 1, further comprising:
   a first switching device which has a first electrode connected to the first conductive line;
   a second switching device which has a control electrode connected to a second electrode of the first switching device, a first electrode connected to the second conductive line, and a second electrode connected to the pixel electrode; and
   an organic emitting layer disposed on and overlapping the pixel electrode,
   wherein the pixel electrode and organic emitting layer are component parts of an organic light emitting diode.

5. The display device of claim 4, wherein the first conductive line is a data line which provides a data signal to the first electrode of the first switching device, and the second conductive line is a driving voltage line which provides a driving voltage to the first electrode of the second switching device.

6. The display device of claim 5, wherein the distance between the first conductive line and the second conductive line is about 5 to 10 μm.

7. The display device of claim 1, wherein a distance from a side of the pixel electrode to a side of the first conductive line is equal to a distance from the other side of the first conductive line to a side of the second conductive line and also equal to a distance from the other side of the second conductive line to the other side of the pixel electrode.

8. The display device of claim 1, further comprising:
   a black matrix which comprises an opening region overlapping the pixel electrode; and
   a photosensitive member which overlaps the opening region.

9. The display device of claim 8, wherein the black matrix is disposed on the pixel electrode, and the photosensitive member is disposed on the black matrix to overlap the pixel electrode.

10. An organic light-emitting display device comprising:
    a substrate;
    a first conductive line disposed on the substrate and extending in a first direction;
    a second conductive line extending in the first direction; and
    a pixel electrode disposed on the first and second conductive lines overlapping the first and second conductive lines,
    wherein:
    a distance between the first conductive line and the second conductive line is about 0 to 10 μm in a plan view; and
    a difference between a minimum distance from an upper surface of the substrate to a lower surface of the pixel electrode and a maximum distance from the upper surface of the substrate to the lower surface of the pixel electrode is about 70 nm or less.

11. The display device of claim 10, further comprising a connecting electrode disposed on a different layer from the second conductive line.

12. The display device of claim 10, wherein the pixel further comprises:
    a driving transistor which has a source electrode connected to a driving voltage terminal and a drain electrode connected to the pixel electrode; and a switching transistor which has a drain electrode connected to a gate electrode of the driving transistor.

13. The display device of claim 12, wherein one of the first and second conductive lines comprises a data line which provides a data signal to a source electrode of the switching transistor.

14. The display device of claim 12, further comprising an initialization line configured to provide an initialization signal to the gate electrode of the driving transistor.

15. The display device of claim 12, wherein one of the first and second conductive lines comprises a driving voltage line which is connected to the source electrode of the driving transistor and the driving voltage terminal.

16. The display device of claim 12, wherein the first and second conductive lines are not electrically connected to the driving transistor and the switching transistor.

17. The display device of claim 10, further comprising an insulating layer disposed between the first conductive line and the second conductive line.

18. The display device of claim 17, further comprising an overcoat layer which is disposed between the second conductive line and the pixel electrode and has a first thickness and a second thickness, wherein the first thickness of the overcoat layer is defined as a minimum distance from an upper surface of the insulating layer to an upper surface of the overcoat layer, and the second thickness of the overcoat layer is defined as a maximum distance from the upper surface of the insulating layer to the upper surface of the overcoat layer, wherein a difference between the first thickness and the second thickness is about 70 nm or less.

* * * * *